United States Patent
Saito et al.

(10) Patent No.: US 8,026,561 B2
(45) Date of Patent: Sep. 27, 2011

(54) SPIN MOSFET AND RECONFIGURABLE LOGIC CIRCUIT

(75) Inventors: Yoshiaki Saito, Kawasaki (JP);
Hideyuki Sugiyama, Kawasaki (JP);
Tomoaki Inokuchi, Kawasaki (JP);
Takao Marukame, Tokyo (JP); Mizue Ishikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/725,561

(22) Filed: Mar. 17, 2010

(65) Prior Publication Data

US 2010/0244897 A1   Sep. 30, 2010

(30) Foreign Application Priority Data

Mar. 25, 2009   (JP) ................ 2009-074785

(51) Int. Cl.
*H01L 21/02* (2006.01)

(52) U.S. Cl. ........... 257/421; 257/295; 257/E29.165; 257/E29.273; 257/E21.209; 257/E21.437; 257/E21.664

(58) Field of Classification Search .......... 257/295, 257/421–423; 438/3; 365/49.13
See application file for complete search history.

(56) References Cited

U.S. PATENT DOCUMENTS

| | | | |
|---|---|---|---|
| 6,451,215 B1 * | 9/2002 | Shimazawa et al. | 216/22 |
| 6,703,676 B2 * | 3/2004 | Hirai et al. | 257/421 |
| 6,894,304 B2 * | 5/2005 | Moore | 257/4 |
| 6,963,091 B1 * | 11/2005 | Vashchenko et al. | 257/213 |
| 7,230,308 B2 * | 6/2007 | Iwata | 257/421 |
| 7,248,497 B2 * | 7/2007 | Saito et al. | 365/158 |
| 7,307,875 B2 * | 12/2007 | Johnson | 365/158 |
| 7,411,235 B2 * | 8/2008 | Saito et al. | 257/295 |
| 7,547,934 B2 * | 6/2009 | Saito | 257/295 |

(Continued)

FOREIGN PATENT DOCUMENTS

JP   2008-66596   3/2008

(Continued)

OTHER PUBLICATIONS

Satoshi Sugahara, et al. "A spin metal-oxide-semiconductor field-effect transistor using half-metallic-ferromagnet contacts for the source and drain," Applied Physics Letters, vol. 84, No. 13. Mar. 29, 2004. pp. 2307-2309.

(Continued)

*Primary Examiner* — Eugene Lee
*Assistant Examiner* — Mohammed Shamsuzzaman
(74) *Attorney, Agent, or Firm* — Oblon, Spivak, McClelland, Maier & Neustadt, L.L.P.

(57) ABSTRACT

A spin MOSFET includes: a first ferromagnetic layer provided on an upper face of a semiconductor substrate, and having a fixed magnetization direction perpendicular to a film plane; a semiconductor layer provided on an upper face of the first ferromagnetic layer, including a lower face opposed to the upper face of the first ferromagnetic layer, an upper face opposed to the lower face, and side faces different from the lower face and the upper face; a second ferromagnetic layer provided on the upper face of the semiconductor layer, and having a variable magnetization direction perpendicular to a film plane; a first tunnel barrier provided on an upper face of the second ferromagnetic layer; a third ferromagnetic layer provided on an upper face of the first tunnel barrier; a gate insulating film provided on the side faces of the semiconductor layer; and a gate electrode provided on the side faces of the semiconductor layer with the gate insulating film being interposed therebetween.

11 Claims, 23 Drawing Sheets

U.S. PATENT DOCUMENTS

| | | | |
|---|---|---|---|
| 7,598,578 B2* | 10/2009 | Nakamura et al. | 257/421 |
| 7,602,636 B2 | 10/2009 | Saito et al. | |
| 7,629,658 B2 | 12/2009 | Sugiyama et al. | |
| 7,714,400 B2* | 5/2010 | Sugahara et al. | 257/421 |
| 2003/0080391 A1* | 5/2003 | Hirai et al. | 257/421 |
| 2004/0150017 A1* | 8/2004 | Tsang | 257/295 |
| 2004/0159868 A1* | 8/2004 | Rinerson et al. | 257/295 |
| 2005/0242382 A1* | 11/2005 | Daughton et al. | 257/295 |
| 2006/0060901 A1* | 3/2006 | Nakamura et al. | 257/295 |
| 2006/0118842 A1* | 6/2006 | Iwata | 257/295 |
| 2007/0063237 A1* | 3/2007 | Huai et al. | 257/295 |
| 2007/0064342 A1* | 3/2007 | Nakamura et al. | 360/119 |
| 2007/0097736 A1* | 5/2007 | Inokuchi et al. | 365/158 |
| 2007/0158716 A1* | 7/2007 | Rinerson et al. | 257/295 |
| 2007/0228432 A1* | 10/2007 | Ishihara et al. | 257/295 |
| 2007/0241410 A1* | 10/2007 | Umehara et al. | 257/379 |
| 2008/0061332 A1* | 3/2008 | Saito et al. | 257/295 |
| 2008/0204943 A1* | 8/2008 | Fuji et al. | 360/324.1 |
| 2008/0239930 A1* | 10/2008 | Saito et al. | 369/126 |
| 2009/0180215 A1* | 7/2009 | Ishikawa et al. | 360/313 |
| 2009/0200592 A1* | 8/2009 | Tsuchiaki et al. | 257/295 |
| 2009/0236646 A1* | 9/2009 | Sugahara et al. | 257/295 |
| 2009/0244960 A1* | 10/2009 | Saito et al. | 365/158 |
| 2010/0019798 A1 | 1/2010 | Saito et al. | |
| 2010/0072524 A1* | 3/2010 | Huai et al. | 257/295 |

FOREIGN PATENT DOCUMENTS

| | | |
|---|---|---|
| JP | 2008-226901 | 9/2008 |
| JP | 2008-243992 | 10/2008 |
| JP | 2008-252018 | 10/2008 |

OTHER PUBLICATIONS

Office Action issued Mar. 18, 2011, in Japan Patent Application No. 2009-074785 (with English translation).

* cited by examiner

AND(MOSFET152;AP STATE)

| A | B | $V_{fg}$ | $V_1$ | $V_{out}$ |
|---|---|---|---|---|
| 0 | 0 | 0 | 1 | 0 |
| 1 | 0 | 1/2 | ~1 | 0 |
| 0 | 1 |  | ~1 | 0 |
| 1 | 1 | 1 | 0 | 1 |

FIG. 23

OR(MOSFET152;P STATE)

| A | B | $V_{fg}$ | $V_1$ | $V_{out}$ |
|---|---|---|---|---|
| 0 | 0 | 0 | 1 | 0 |
| 1 | 0 | 1/2 | ~0 | 1 |
| 0 | 1 |  | ~0 | 1 |
| 1 | 1 | 1 | 0 | 1 |

FIG. 24

SPIN MOSFET AND RECONFIGURABLE LOGIC CIRCUIT

CROSS-REFERENCE TO RELATED APPLICATION

This application is based upon and claims the benefit of priority from prior Japanese Patent Application No. 2009-74785 filed on Mar. 25, 2009 in Japan, the entire contents of which are incorporated herein by reference.

BACKGROUND OF THE INVENTION

1. Field of the Invention

The present invention relates to a spin MOSFET and a reconfigurable logic circuit.

2. Related Art

In recent years, MRAM (Magnetic Random Access Memory) with a MTJ (Magnetic Tunnel Junction) having a tunnel barrier layer interposed between two vertical magnetization films has been drawing attention, for its lower spin injection current density and excellent thermal stability. In this specification, a "vertical magnetization film" is a ferromagnetic film that has a magnetization direction (a magnetization easy-axis direction) substantially perpendicular to its upper face.

Meanwhile, intensive research and development are being made with respect to devices having novel functions such as spin MOSFETs. One of those devices is a spin MOSFET having source/drain regions made of a magnetic material. A spin MOSFET is characteristically capable of controlling its output properties simply by reversing the direction of the spin moment of the magnetic material of the source/drain regions. By taking advantage of this feature, it is possible to form a spin MOSFET having a reconfigurable function and an amplifying function, or a reconfigurable logic circuit (see APL84 (2004) 2307, for example).

As a spin torque transfer switching method, a write method involving spin injection has been suggested. A spin torque transfer switching can be seen by spin-injecting spin-polarized current. Also, to apply spin injection writing to spin MOSFETs, a structure having a MTJ in one of the magnetic bodies forming the source/drain regions has been suggested (see JP-A 2008-66596 (KOKAI)). With the use of the structure disclosed in JP-A 2008-66596 (KOKAI), the following effects can be achieved:

1) Two outputs can be used for reading; and
2) A spin torque transfer switching can be utilized, since a MTJ (a ferromagnetic stacked film) is provided.

Also, the use of vertical magnetization films in the MTJ in the source/drain region in a spin MOSFET has been suggested by the inventor, and has been filed for a patent by the applicant (Japanese Patent Application No. 2008-191146). In this spin MOSFET, source/drain regions are provided at a distance from each other in a semiconductor substrate, and a gate electrode is formed on a semiconductor region to be the channel region between the source region and the drain region. A ferromagnetic stacked film having a vertical magnetization film is provided on each of the source/drain regions, and at least one of the ferromagnetic stacked films on the source/drain regions has a MTJ structure (hereinafter also referred to as a lateral structure). With this structure, the spin-injection write current density can be lowered, the areas of the source/drain portions can be reduced, and thermal stability can be advantageously secured in a spin MOSFET.

In a case where vertical magnetization films are used in the MTJ of the source or drain region, however, a leakage magnetic field generated from the fixed magnetization layer of the MTJ affects the magnetic recording layer, and shift adjustment cannot be performed, as will be described below. Such a leakage magnetic field also affects adjacent spin MOSFETs. In such a spin MOSFET having a lateral structure including vertical magnetization films, spin relaxation in the semiconductor region to be the channel region is accelerated due to the leakage magnetic field. This problem was not recognized in the past, and was recognized first by the inventor.

As described above, in a spin MOSFET using vertical magnetization films in the ferromagnetic material of the MTJ in the source/drain region, the spin-injection write current density becomes lower, and excellent thermal stability and the likes can be achieved. However, a spin MOSFET having a lateral structure has the following problems: difficult field shift adjustment, influence of a leakage magnetic field on adjacent transistors, and accelerated spin relaxation in the semiconductor region to be the channel region due to the leakage magnetic field.

SUMMARY OF THE INVENTION

The present invention has been made in view of these circumstances, and an object thereof is to provide a spin MOSFET that can reduce the influence of a leakage magnetic field on adjacent transistors, enable shift adjustment, and restrain spin relaxation in the channel region, even where vertical magnetization films are used in the ferromagnetic material of the MTJ in the source/drain region. The present invention also aims to provide a reconfigurable logic circuit.

A spin MOSFET according to a first aspect of the present invention includes: a first ferromagnetic layer provided on an upper face of a semiconductor substrate, and having a fixed magnetization direction perpendicular to a film plane; a semiconductor layer provided on an upper face of the first ferromagnetic layer, including a lower face opposed to the upper face of the first ferromagnetic layer, an upper face opposed to the lower face, and side faces different from the lower face and the upper face, and serving as a channel; a second ferromagnetic layer provided on the upper face of the semiconductor layer, and having a variable magnetization direction perpendicular to a film plane; a first tunnel barrier provided on an upper face of the second ferromagnetic layer; a third ferromagnetic layer provided on an upper face of the first tunnel barrier; a gate insulating film provided on the side faces of the semiconductor layer; and a gate electrode provided on the side faces of the semiconductor layer with the gate insulating film being interposed therebetween.

A spin MOSFET according to a second aspect of the present invention includes: a first ferromagnetic layer formed on an upper face of a semiconductor substrate; a first tunnel barrier provided on an upper face of the first ferromagnetic layer; a second ferromagnetic layer provided on an upper face of the first tunnel barrier, and having a variable magnetization direction perpendicular to a film plane; a semiconductor layer provided on an upper face of the second ferromagnetic layer, including a lower face opposed to the upper face of the second ferromagnetic layer, an upper face opposed to the lower face, and side faces different from the lower face and the upper face, and serving as a channel; a third ferromagnetic layer provided on the upper face of the semiconductor layer, and having a fixed magnetization direction perpendicular to a film plane; a gate insulating film provided on the side faces of the semiconductor layer; and a gate electrode provided on the side faces of the semiconductor layer with the gate insulating film being interposed.

A spin MOSFET according to a third aspect of the present invention includes: a source unit and a drain unit provided at a distance from each other on a semiconductor substrate, one of the source unit and the drain unit comprising a first ferromagnetic stacked film that includes a first ferromagnetic layer having a fixed magnetization direction perpendicular to a film plane, the other one of the source unit and the drain unit comprising a second ferromagnetic stacked film that includes a second ferromagnetic layer having a variable magnetization direction perpendicular to a film plane, a first tunnel barrier provided on the second ferromagnetic layer, and a third ferromagnetic layer provided on the first tunnel barrier and having a fixed magnetization direction perpendicular to a film plane and antiparallel to the magnetization direction of the first ferromagnetic layer; a gate insulating film provided on a portion of the semiconductor substrate, the portion being located between the source unit and the drain unit; a gate electrode provided on the gate insulating film; a first hard bias film provided above the gate electrode; a second hard bias film provided above a portion of the semiconductor substrate, the portion being located on a first side of the source unit, the first side being opposite to a second side on which the first hard bias film is disposed; and a third hard bias film provided above a portion of the semiconductor substrate, the portion being located on a third side of the drain unit, the third side being opposite to a fourth side on which the first hard bias film is disposed, magnetization directions of the first through third hard bias films being parallel to the magnetization direction of the third ferromagnetic layer.

A spin MOSFET according to a fourth aspect of the present invention includes: a source unit and a drain unit provided at a distance from each other on a semiconductor substrate, one of the source unit and the drain unit comprising a first ferromagnetic stacked film that includes a first ferromagnetic layer having a fixed magnetization direction perpendicular to a film plane, the other one of the source unit and the drain unit comprising a second ferromagnetic stacked film that includes a second ferromagnetic layer having a variable magnetization direction perpendicular to a film plane, a first tunnel barrier provided on the second ferromagnetic layer, and a third ferromagnetic layer provided on the first tunnel barrier and having a fixed magnetization direction perpendicular to a film plane and antiparallel to the magnetization direction of the first ferromagnetic layer; a gate insulating film provided on a portion of the semiconductor substrate, the portion being located between the source unit and the drain unit; a gate electrode provided on the gate insulating film; a first hard bias film provided on the gate electrode; a second hard bias film provided on the source unit; and a third hard bias film provided on the drain unit, magnetization directions of the first through third hard bias films being substantially antiparallel to the magnetization direction of the third ferromagnetic layer.

A reconfigurable logic circuit according to a fifth aspect of the present invention includes: two field effect transistors, at least one of the two field effect transistors being the spin MOSFET according to the first aspect, the two field effect transistors having a common floating gate.

BRIEF DESCRIPTION OF THE DRAWINGS

FIG. 8($b$) is a diagram for explaining an in-plane shape of a MTJ that does not easily have a magnetization reversal at the time of spin injection;

FIG. 23 shows a logical table in a case where the logic circuit of the thirteenth embodiment functions as an AND circuit;

FIG. 24 shows a logical table in a case where the logic circuit of the thirteenth embodiment functions as an OR circuit;

DETAILED DESCRIPTION OF THE INVENTION

The following is a description of embodiments of the present invention, with reference to the accompanying drawings. Those drawings are merely schematic, and the sizes of the components and the relative sizes of the components differ from those in reality. Also, the sizes or proportions of the same components might vary among the drawings.

First Embodiment

Figure 1:
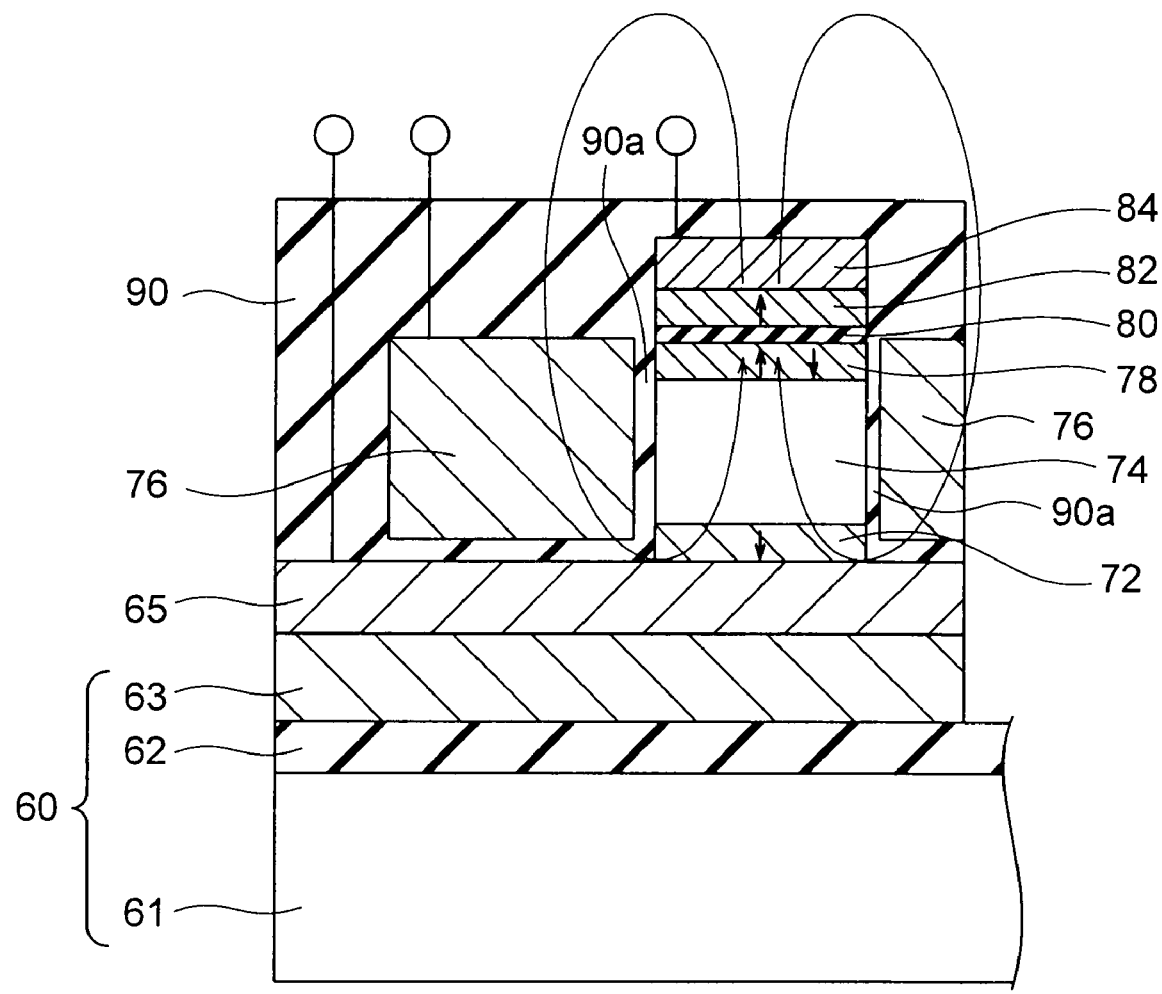
FIG. 1 is a cross-sectional view of a spin MOSFET according to a first embodiment of the present invention.
Figure 27:
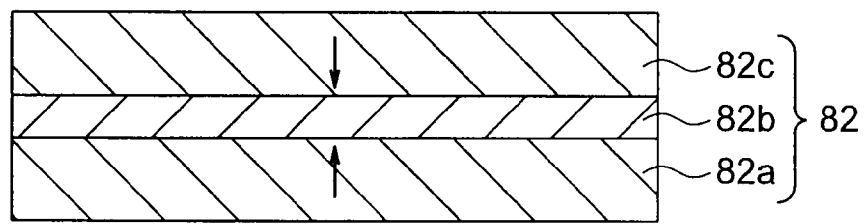
FIG. 27 is a cross-sectional view of a ferromagnetic layer having a synthetic structure in which ferromagnetic films are stacked via a nonmagnetic film.

FIG. 1 shows a spin MOSFET according to a first embodiment of the present invention. The spin MOSFET of this embodiment is a vertical type spin MOSFET, and is formed on a SOI substrate 60 that includes a supporting substrate 61 made of Si, a buried oxide film 62, and a SOI (Silicon On Insulator) layer 63. The spin MOSFET may be formed on a Si bulk substrate, instead of a SOI substrate. A base layer 65 is formed on the SOI layer 63. A ferromagnetic layer 72 that has magnetization substantially perpendicular to a film plane and has a fixed magnetization direction is formed on the base layer 65. In this specification, a "film plane" of a ferromagnetic layer is an upper face of the ferromagnetic layer. A channel layer 74 that is formed from p-type semiconductor crystals is formed on the ferromagnetic layer 72. A free layer 78 that has a variable magnetization direction and is formed of a ferromagnetic layer is formed on the channel layer 74. A tunnel barrier 80 is formed on the free layer 78, and a ferromagnetic layer 82 having vertical magnetization is formed on the tunnel barrier 80. As shown in FIG. 27, this ferromagnetic layer 82 has a synthetic structure in which ferromagnetic films 82a, 82c having vertical magnetization are stacked via a nonmagnetic film 82b, or a stacked structure formed of a first ferromagnetic film 82a, a nonmagnetic film 82b, and a second ferromagnetic film 82c. The first ferromagnetic film 82a and the second ferromagnetic film 82c each have a magnetization direction fixed (invariable) in a direction substantially perpendicular to the film plane, and are antiferromagnetically coupled via the nonmagnetic film 82b. In other words, the ferromagnetic layer 82 is a fixed magnetization layer. In this embodiment, the free layer 78, the tunnel barrier 80, and the ferromagnetic layer 82 forms a ferromagnetic stacked film MTJ. A nonmagnetic metal layer 84 is formed on the ferromagnetic layer 82. Instead of the nonmagnetic metal layer 84, an antiferromagnetic layer may be used. In such a case, the magnetization of the ferromagnetic layer 82 is stabilized. Alternatively, the ferromagnetic layer 72 may have a synthetic structure in which ferromagnetic films having vertical magnetization are stacked, with a nonmagnetic film in between. In this embodiment, the magnetization directions of the ferromagnetic layer 72 and the ferromagnetic film of the ferromagnetic layer 82 closest to the channel layer 74 are substantially antiparallel to each other. The free layer 78 may have a synthetic structure in which ferromagnetic films are stacked, with a nonmagnetic film being interposed in between.

Figure 28:
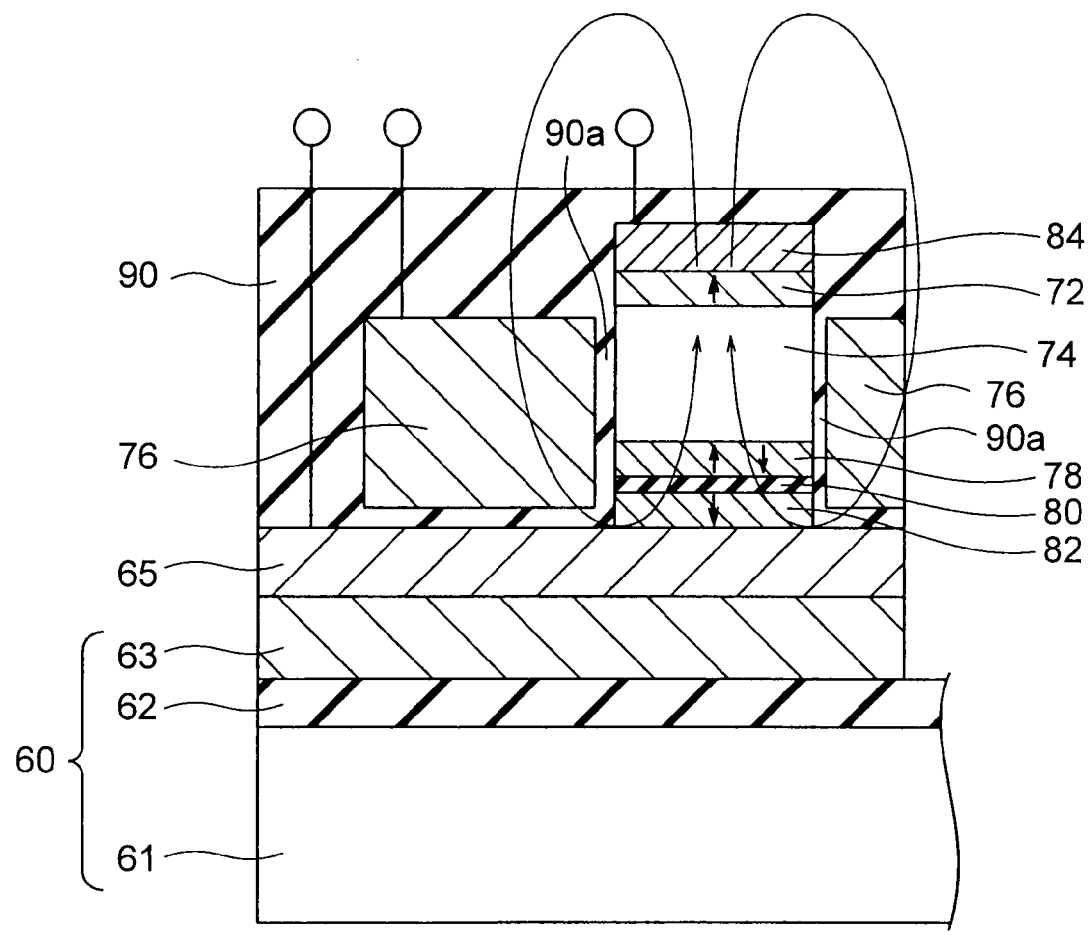
FIG. 28 is a cross-sectional view of a spin MOSFET according to a modification of the first embodiment.

As described above, in this embodiment, a stacked structure that is formed of the ferromagnetic layer 72, the channel layer 74 formed from semiconductor crystals, the free layer 78, the tunnel barrier 80, the ferromagnetic layer 82, and the nonmagnetic layer 84, is formed on the base layer 65. In this stacked structure, as shown in FIG. 28, the layers may be stacked in reverse order, except for the nonmagnetic metal layer 84. More specifically, the stacked structure formed on the base layer 65 may be formed by stacking the ferromagnetic layer 82, the tunnel barrier 80, the free layer 78, the channel layer 74 formed from semiconductor crystals, the ferromagnetic layer 72, and the nonmagnetic metal layer 84 in this order. A gate electrode 76 is formed to surround the channel layer 74 of this stacked structure, with a gate insulating film 90a being interposed therebetween. Incidentally, the gate insulating film 90a may be provided on a part of the side faces of the semiconductor layer, and the gate electrode 76 may be provided on the side faces of the semiconductor layer with the gate insulating film being interposed therebetween. An insulating film 90 is further provided between the gate electrode 90 and the base layer 65.

In this embodiment having the above structure, a synthetic structure is used as the fixed magnetization layer 82. The fixed magnetization layer 82 is separated from the ferromagnetic layer 72 by the channel layer 74, and the gate electrode 76 is provided on the side faces. Accordingly, the shift of the free layer 78 located below the fixed magnetization layer 82 via the tunnel barrier 80 can be adjusted. Also, in a case where adjacent cells are closely arranged, influence of the leakage magnetic filed can be eliminated. Since the spin MOSFET of this embodiment is a vertical structure and has the ferromagnetic layer 82 with a magnetization direction antiparallel to the magnetization direction of the ferromagnetic layer 72, the lines of magnetic force generated from the ferromagnetic layer 82 (the magnetic force indicated by solid lines in FIG. 1) are opposite to the lines of magnetic force generated from the ferromagnetic layer 72 (the magnetic force not shown in FIG. 1), and the leakage magnetic field is substantially cancelled accordingly. Even if the leakage magnetic field is not cancelled, the direction of spin-polarized electrons flowing in the channel layer 74 is substantially parallel or antiparallel to the directions of the magnetic force generated from the ferromagnetic layer 72 and the ferromagnetic layer 82. Accordingly, the spin-polarized electrons are hardly affected by the leakage magnetic field. Thus, the channel layer 74 is hardly affected by the leakage magnetic field, and spin relaxation can be restrained.

In this embodiment, source/drain regions doped with n-type impurities at high density should preferably be formed in the interfacial sides of the ferromagnetic layer 72 and the free layer 78 in the side of the channel layer 74.

The gate insulating film 90a may be a $SiO_2$ film used in conventional MOSFET, or may be made of a high-dielectric material formed by melting a metal such as Zr, Hf, or La in $SiO_2$ such as Hf silicate or Zr silicate. P-type-impurities-doped or n-type-impurities-doped poly-Si or poly-SiGe is used as the gate electrode 76. In a case where the poly-Si or poly-SiGe is combined with a high-dielectric insulating film, it is possible to use a metal-based material such as TiN, TaN, TaC, a rare-earth metal, or a rare-earth transition metal alloy.

Since a MTJ formed of the free layer 78, the tunnel barrier 80, and the ferromagnetic layer 82 is provided in this embodiment, spin injection writing can be preformed. In spin injection writing, the magnetization direction of the free layer 78 can be changed by switching the direction of the current flow between an upward direction and a downward direction in the structure shown in FIG. 1.

As described above, in accordance with this embodiment, influence of a leakage magnetic field on adjacent transistors can be eliminated, and shift adjustment can be performed.

Second Embodiment

Figure 2:
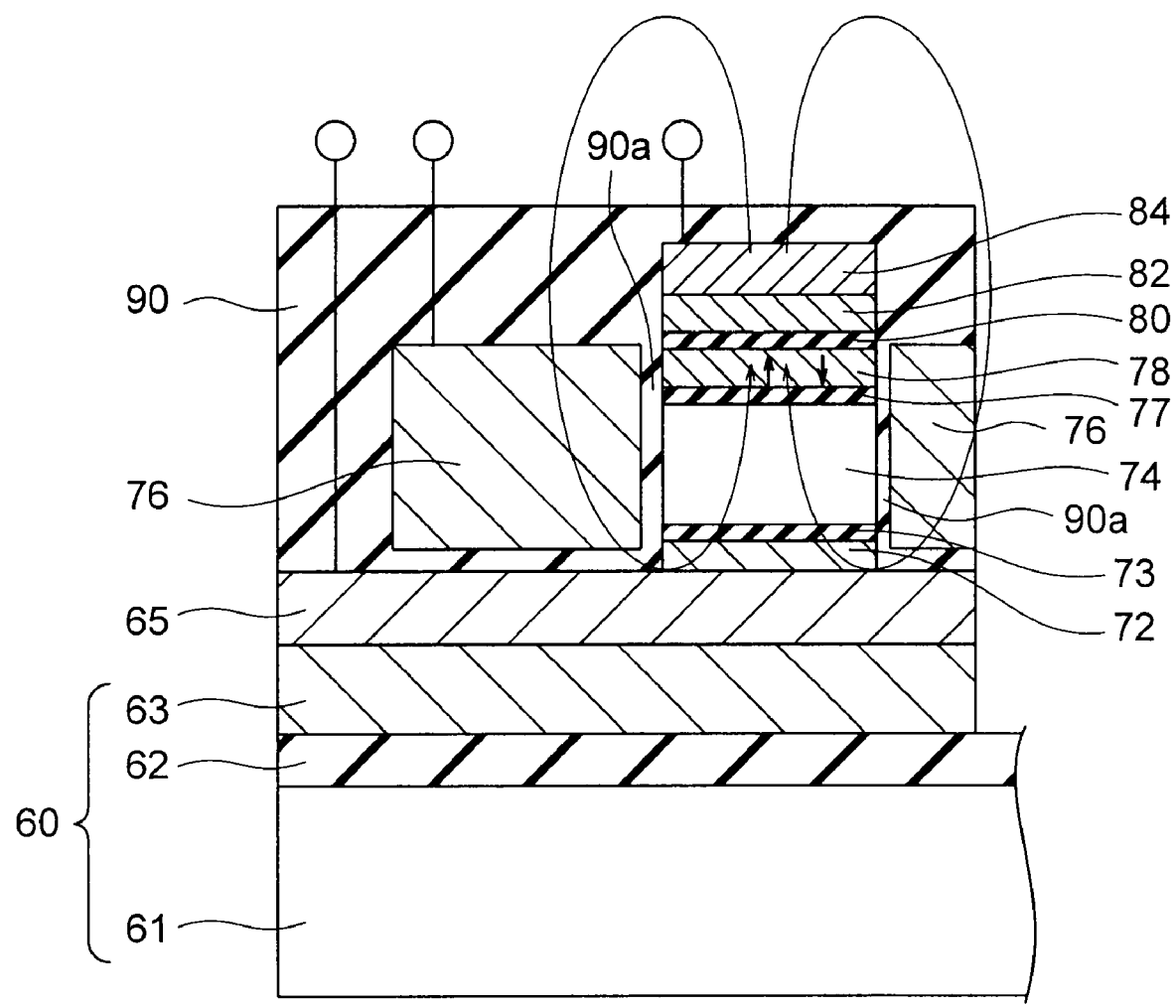
FIG. 2 is a cross-sectional view of a spin MOSFET according to a second embodiment of the present invention.

FIG. 2 is a spin MOSFET according to a second embodiment of the present invention. The spin MOSFET of this embodiment is a vertical spin MOSFET, and is the same as the spin MOSFET of the first embodiment shown in FIG. 1, except that a tunnel barrier 73 is provided between the channel layer 74 formed from semiconductor crystals and the ferromagnetic layer 72, and a tunnel barrier 77 provided between the channel layer 74 and the free layer 78. If tunnel barriers made of a material such as MgO that can epitaxially grow even if the channel layer 74 is made of Ge or GaAs are used as the tunnel barriers 73 and 77, the tunnel barriers 73 and 77 can also serve as diffusion barriers, and advantageously improve the resistance to device pressure. In this embodiment, a stacked structure that is formed of the ferromagnetic layer 72, the tunnel barrier 73, the channel layer 74 formed from semiconductor crystals, the tunnel barrier 77, the free layer 78, the tunnel barrier 80, the ferromagnetic layer 82, and the nonmagnetic layer 84, is formed on the base layer 65. In this stacked structure, the layers may be stacked in reverse order, except for the nonmagnetic metal layer 84, as in the first embodiment. More specifically, the stacked structure formed on the base layer 65 may be formed by stacking the ferromagnetic layer 82, the tunnel barrier 80, the free layer 78, the tunnel barrier 77, the channel layer 74 formed from semiconductor crystals, the tunnel barrier 73, the ferromagnetic layer 72, and the nonmagnetic metal layer 84 in this order.

In this embodiment, influence of a leakage magnetic field on adjacent transistors can be eliminated as in the first embodiment. Accordingly, spin relaxation can be restrained, and shift adjustment can be performed.

In the first and the second embodiments, the uppermost SOI layer may be a Si crystal layer or a SiGe crystal layer. As for the material of the semiconductor channel layer, it is possible to select a material such as Si, SiGe, GaAs, or InGaAs, instead of Ge. In such a case, it is essential to take into consideration the influence of the crystal lattice of the lowest SOI layer 63 on the lattice spacing in the magnetic layer 72 and the channel layer 74. Particularly, the lattice and distortion in the channel layer 74 has large influence on the mobility of the carriers in the channel layer 74. It is preferable to match the lattice spacing in the magnetic layer 72 with the lattice in the base layer 65. However, the lattice of the semiconductor crystals in the channel layer 74, which is slightly different from the crystal lattice in the base layer 65, is selected, and distortion is actively caused. In this manner, the channel mobility can be increased. For example, SiGe crystals with 80% Ge composition are arranged to form the base layer 65, and the magnetic layer 72 that lattice-matches the crystals is stacked. A Ge crystal layer as the channel layer 74 is then stacked. The Ge crystal lattice of the channel layer 74 becomes slightly larger than the lattice of the SiGe crystal layer. Therefore, the crystal lattice of the channel layer 74 contracts due to compression distortion applied in a transverse direction in conformity to the base layer 65, and expands due to tensile stress applied in a vertical direction. In this manner, the tensile stress is applied in the current flowing direction of the spin MOSFET, and the electron mobility is effectively increased.

Third Embodiment

Figure 3:
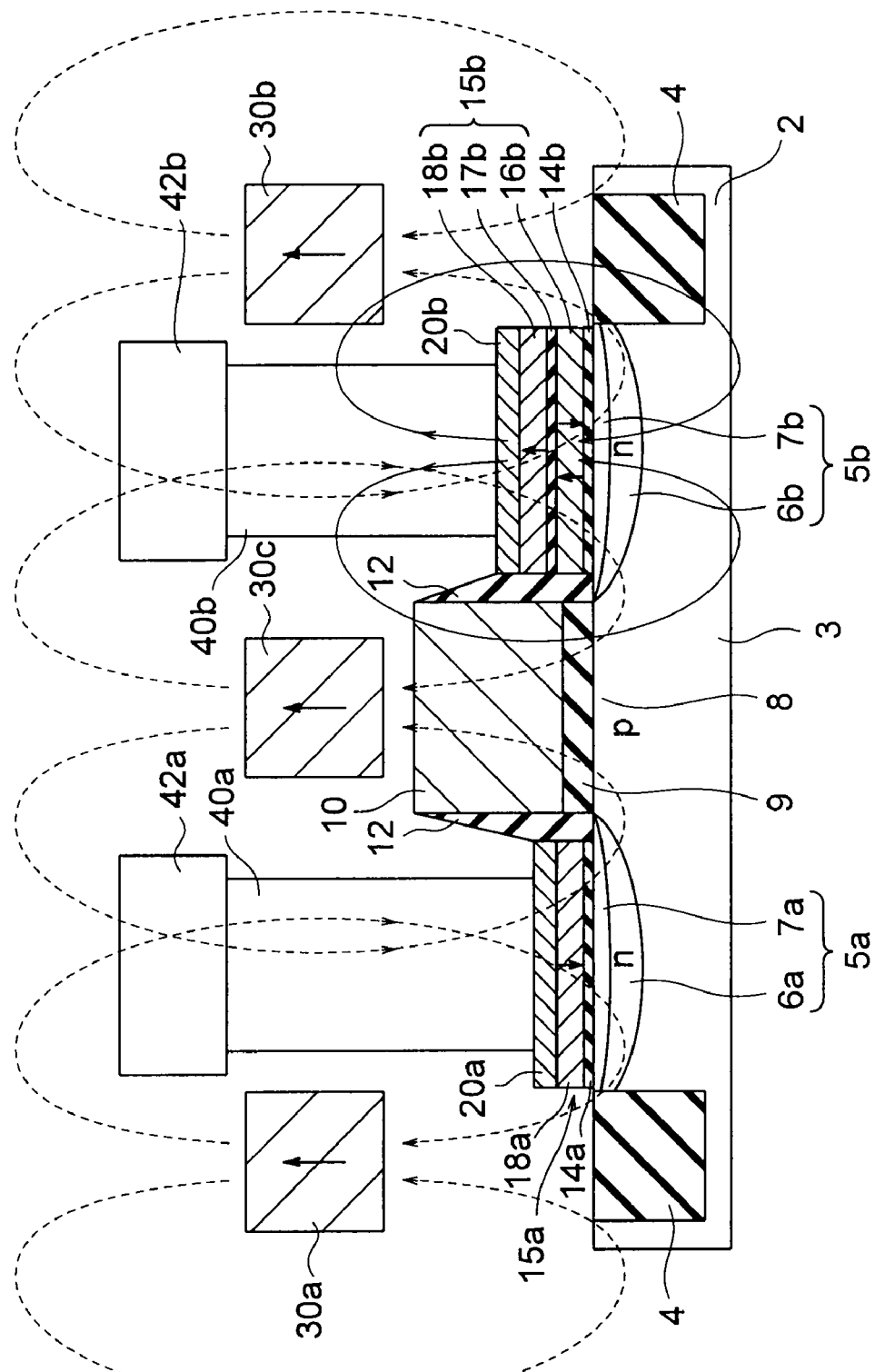
FIG. 3 is a cross-sectional view of a spin MOSFET according to a third embodiment of the present invention.

FIG. 3 is a cross-sectional view of a spin MOSFET according to a third embodiment of the present invention. The spin MOSFET of this embodiment is a lateral n-type spin MOSFET that is formed in a device region 3 of a p-type semiconductor substrate 2. This device region 3 is a semiconductor region divided by device-insolating insulating films 4. The semiconductor region may be part of a semiconductor substrate, or may be a well region formed on a semiconductor substrate. Alternatively, the semiconductor region may be a SOI layer on a SOI substrate. In this specification, the device region 3 may be a semiconductor region that is part of a p-type semiconductor substrate, or may be a p-well region formed on an n-type substrate. In this device region 3, an n-type impurity diffusion region 6a and an n-type impurity diffusion region 6b are formed at a distance from each other. An $n^+$-impurity diffusion region 7a and an $n^+$-type impurity diffusion region 7b having higher density than the n-type impurity diffusion region 6a and the n-type impurity diffusion region 6b are formed on the surfaces of the n-type impurity diffusion region 6a and the n-type impurity diffusion region 6b, respectively. The n-type impurity diffusion region 6a and the $n^+$-impurity diffusion region 7a form a source region 5a, and the n-type impurity diffusion region 6b and the $n^+$-type impurity diffusion region 7b form a drain region 5b.

A gate insulating film 9 is provided on a portion of the semiconductor substrate 2 that is to serve as a channel region 8 located between the source region 5a and the drain region 5b. A gate 10 made of a nonmagnetic metal is placed on the gate insulating film 9, for example. A source unit 15a is formed on the source region 5a, with a tunnel barrier 14a being interposed in between. A drain unit 15b is formed on the drain region 5b, with a tunnel barrier 14b being interposed in between. The source unit 15a is formed of a ferromagnetic layer 18a. The drain unit 15b has a ferromagnetic stacked structure (a ferromagnetic stacked film) in which a ferromagnetic layer 16b, a nonmagnetic layer 17b, and a ferromagnetic layer 18b are stacked in this order. In a case where the nonmagnetic layer 17b is a tunnel barrier, the drain unit 15b is a ferromagnetic tunnel junction (MTJ (Magnetic Tunnel Junction). In this specification, the ferromagnetic stacked film is also referred to as the MTJ stacked film. In this embodiment, the drain unit 15b has a MTJ structure, and the source unit 15a is formed of a ferromagnetic layer. However, the source unit 15a may have a MTJ structure, and the drain unit 15b may be formed of a ferromagnetic layer.

In this embodiment, the ferromagnetic layer 18a of the source unit 15a is a fixed magnetization layer that has a fixed (invariable) magnetization direction. The ferromagnetic layer 16b of the drain unit 15b closer to the semiconductor substrate 2 is a free layer (a magnetic recording layer) having a variable magnetization direction. The other ferromagnetic layer 18b of the drain unit 15b, which is farther from the semiconductor substrate 2, is a fixed magnetization layer. In this embodiment, the magnetization direction (the magnetization easy-axis direction) of each of the ferromagnetic layers 16b, 18a, and 18b is substantially perpendicular to the film plane. In this specification, the "film plane" is the upper face of the stacked film.

A nonmagnetic metal layer 20a and a nonmagnetic metal layer 20b are placed on the source unit 15a and the drain unit 15b, respectively. The source unit 15a, the nonmagnetic metal layer 20a, and the gate 10 are insulated from one another by a gate side wall 12 made of an insulating material. The drain unit 15b, the nonmagnetic metal layer 20b, and the gate 10 are insulated from one another by a gate side wall 12 made of an insulating material. The nonmagnetic metal layer 20a is connected to a wiring 42a via a plug 40a, and the nonmagnetic metal layer 20b is connected to a wiring 42b via a plug 40b.

In the spin MOSFET having the above structure, the spin injection write current density can be advantageously lowered, the areas of the source/drain units can be advantageously made smaller, and thermal stability can be achieved.

However, the fixed magnetization layer 18a of the source unit 15a has a leakage magnetic field. Therefore, the spin-polarized electrons flowing in the channel 8 are adversely affected, and the adjacent spin MOSFET on the left (not shown) is also adversely affected in the case illustrated in FIG. 3. If vertical magnetization films are used in the MTJ of the drain unit 15b, the leakage magnetic field from the fixed magnetization layer 18b of the MTJ adversely affects the free layer 16b, to hinder shift adjustment. Also, the adjacent spin MOSFET is adversely affected.

Figure 4:
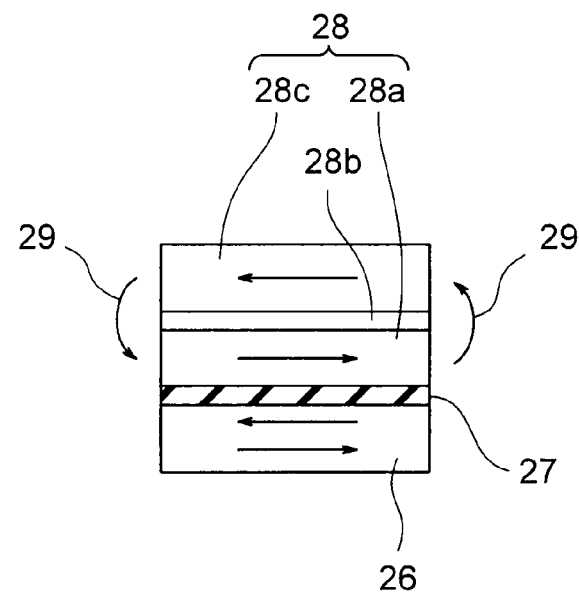
FIG. 4 shows a leakage magnetic field of a MTJ that has fixed magnetization layers with in-plane magnetization and is a synthetic structure.
Figure 5:
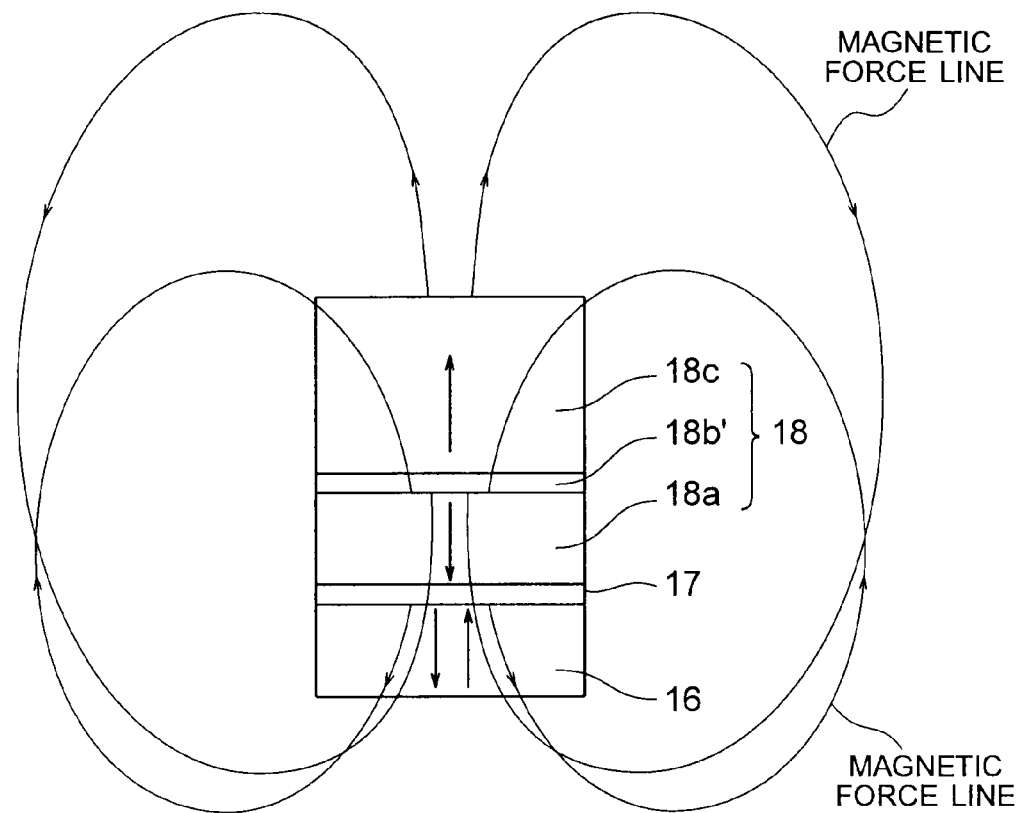
FIG. 5 shows a leakage magnetic field of a MTJ that has fixed magnetization layers with vertical magnetization and is a synthetic structure.

In a case where magnetic films having magnetization substantially parallel to the film plane are used for the MTJ, a synthetic antiferromagnetic stacked structure that includes a nonmagnetic film 28b, and ferromagnetic films 28a and 28c that sandwich the nonmagnetic film 28b, are antiferromagnetically coupled to each other, and have a fixed magnetization direction, is used as the fixed magnetization layer 28 of the MTJ, as shown in FIG. 4. In this synthetic structure, a fixed magnetization layer 28, a free layer 26, and a tunnel barrier layer 27 interposed in between form the MTJ. With the use of the synthetic antiferromagnetic stacked structure, a leakage magnetic field 29 from the ferromagnetic films 28a and 28c having fixed magnetization is cancelled at the edge portions of the ferromagnetic films 28a and 28c. Accordingly, the problem of a leakage magnetic field is not caused in a MTJ having ferromagnetic films with magnetization substantially parallel to the film plane. However, in a case where a synthetic antiferromagnetic stacked structure including vertical magnetization films is used as the fixed magnetization layer of a MTJ, the film thickness of the upper ferromagnetic film 18c of the fixed magnetization layer 18 of the synthetic antiferromagnetic stacked structure is made greater than the film thickness of the lower ferromagnetic film 18a, so as to reduce the leakage magnetic field applied to the free layer 16 of the MTJ, as shown in FIG. 5. In FIG. 5, reference numeral 17 indicates a tunnel barrier layer, and reference numeral 18b' indicates a nonmagnetic film. Even if the film thickness of the upper ferromagnetic film 18c is simply made greater than the film thickness of the lower ferromagnetic film 18a, the leakage magnetic field cannot be canceled, and shift adjustment cannot be performed. Also, the adjacent transistors are adversely affected.

To counter this problem, a hard bias film 30a is placed above the device-isolating insulating film 4 on the side of the source unit 15a, a hard bias film 30b above the device-isolating insulating film 4 on the side of the drain unit 15b, and a hard bias film 30c is placed above the gate electrode 10 in this embodiment, as shown in FIG. 3.

Since the hard bias films 30a, 30b, and 30c are provided, the lines of magnetic force generated from the hard bias films 30a, 30b, and 30c (indicated by the broken lines), and the lines of magnetic force generated from the leakage magnetic field from the fixed magnetization layer (indicated by the solid lines) cancel each other, as shown in FIG. 3. Accordingly, the shift of the free layer 16b located below the fixed magnetization layer 18b via the tunnel barrier layer 17b can be adjusted, and a bias magnetic field is applied in such a direction as to further stabilize thermally the magnetization direction of the fixed magnetization layer 18a of the source unit 15a provided on the opposite side of the gate 10. Since the hard bias films 30a and 30c are placed above the device-isolating insulating films 4 serving as the boundaries of the adjacent spin MOSFETs, the influence of the leakage magnetic filed from the MTJ on the adjacent spin MOSFETs can be restrained.

In this embodiment, the spin MOSFET is an n-MOSFET. More specifically, an n-p-n junction is formed in the semiconductor substrate. The high-density $n^+$-impurity diffusion layers 7a and 7b are formed on the substrate surfaces of the source region 5a and the drain region 5b. This structure can be formed by performing annealing by RTA (Rapid Thermal Annealing), after impurity doping is performed by ion implantation in the same manner as in the formation of a conventional MOS transistor. In a case where a p-MOSFET is formed, instead of the n-MOSFET, a p-n-p junction should be formed with the use of impurities having the opposite conductivity type from the above case, and high-density impurity diffusion layers ($p^+$-impurity diffusion layers) should be formed on the substrate surfaces of the source region and the drain region. By forming the $n^+$-impurity diffusion layers or $p^+$-impurity diffusion layers, the interfacial resistance becomes lower, and a spin MOSFET that can perform spin injection writing at a higher speed can be realized. The replacement of an n-MOSFET with a p-MOSFET can also be applied to the embodiments to be described below.

In this embodiment, to make the magnetization direction of the free layer 16b of the drain unit 15b the same as the magnetization direction (parallel) of the fixed magnetization layer 18b of the drain unit 15b, spin-polarized electrons flow from the drain unit 15b into the source unit 15a through the channel 8. Likewise, to make the magnetization direction of the free layer 16b of the drain unit 15b the opposite from the magnetization direction (antiparallel) of the fixed magnetization layer 18b of the drain unit 15b, spin-polarized electrons flow from the drain unit 15a into the source unit 15b.

In the case of reading, current that does not change the magnetization direction of the free layer of the ferromagnetic stacked film of the drain unit 15b is supplied in the spin MOSFET. By doing so, a predetermined first voltage is applied to the gate 10, and current flows between the source unit 15a and the drain unit 15b through the channel 8. The electric resistance between the source unit 15a and the drain unit 15b is then measured. In this manner, reading can be performed. Also, writing can be performed by applying a predetermined second voltage, different from the first voltage in the case of reading, to the gate 10, and supplying current between the source unit 15a and the drain unit 15b through the channel 8.

In this embodiment, the tunnel barrier layer 14a is provided between the source unit 15a and the source region 5a, and the tunnel barrier layer 14b is provided between the drain unit 15b and the drain region 5b. However, the tunnel barrier layers 14a and 14b may be omitted. In such a case, a Schottky barrier is spontaneously formed at the interface between the source unit 15a and the source region 5a, and at the interface between the drain unit 15b and the drain region 5b. In this case, the adverse influence of a leakage magnetic field on the adjacent transistors can be eliminated, and shift adjustment can be performed.

Figure 6:
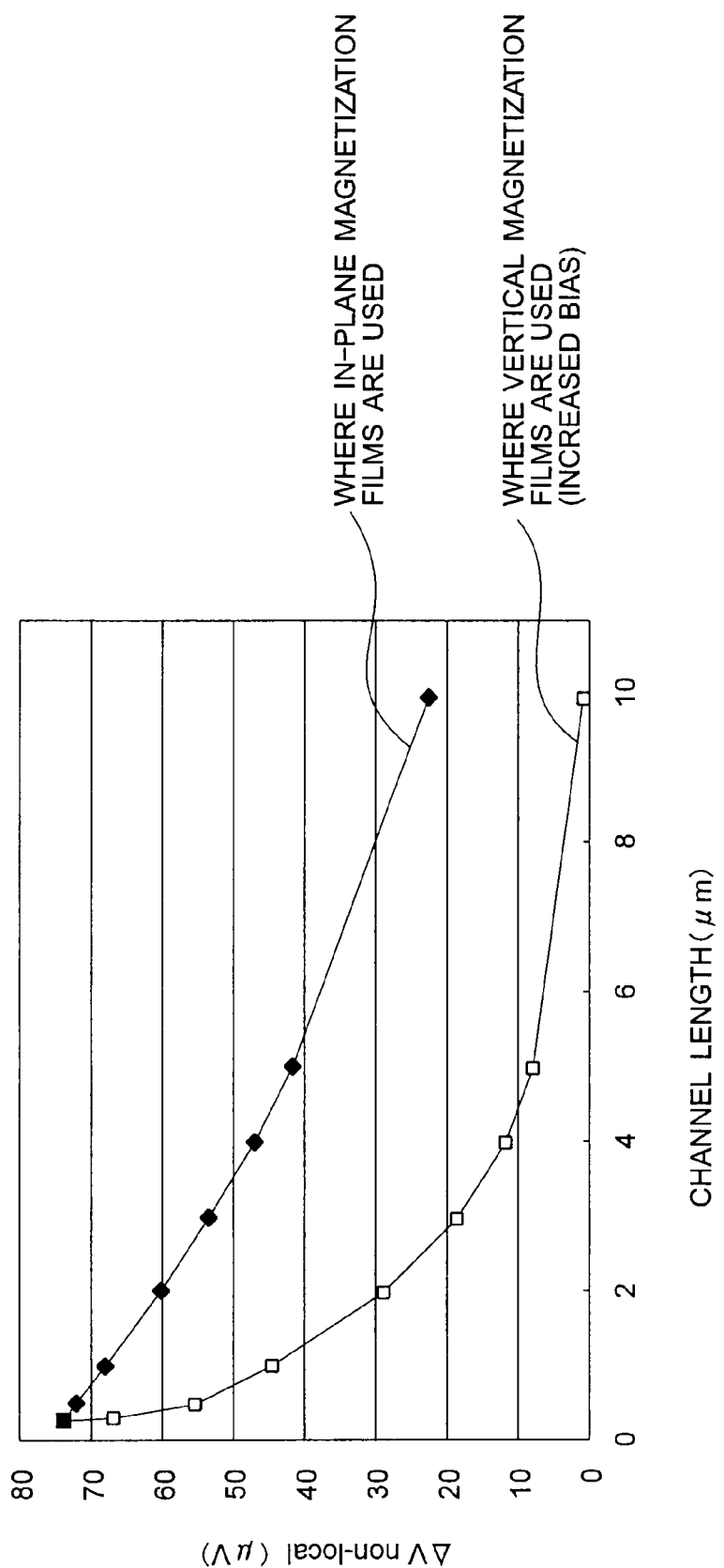
FIG. 6 shows the channel length dependence of the spin diffusion length in the channel region.

In the lateral spin MOSFET having the above structure, it has become apparent that the channel length dependence of the spin diffusion length in the channel region is greater than that in a spin MOSFET having in-plane magnetization films. A spin MOSFET that has a magnetic material with a spin magnetization easy axis existing in the film plane, and a spin MOSFET that has a magnetic material with a magnetization easy axis extending in a direction perpendicular to the film plane are prepared, and the channel length dependence of the spin diffusion length in the channel region is measured. As a result, it becomes apparent that the spin diffusion length becomes smaller as the channel length becomes smaller, as shown in FIG. 6. The ordinate axis in FIG. 6 indicates the signal $\Delta V_{non-local}$ representing the spin diffusion length. FIG. 6 shows the results of measurement carried out on the structure of the spin MOSFET structure that has vertical magnetization films according to the third embodiment illustrated in FIG. 3, and a spin MOSFET structure that has in-plane magnetization films and has the synthetic pin structure shown in FIG. 4 as the fixed magnetization layer without a hard bias magnetic field. The materials used and the manufacture process are the same as those described below in Example 1. The causes of the decrease in the spin diffusion length are considered to be the Hanle effect caused by applying the leakage magnetic field generated from the hard bias films to the channel region, and be the spin relaxation that is caused when the direction of the lines of magnetic force generated from the leakage magnetic field becomes substantially perpendicular to the direction of current (electron flow) flowing in the channel region. The spin diffusion length is evaluated by providing a nonmagnetic ohmic electrode at a 100 µm distance, and measuring the sub spin current observed when the orientations of the magnetic bodies of the source/drain units are changed into a parallel state or an antiparallel state, with the potential of the ohmic electrode being the reference potential. As can be seen from FIG. 6, if the channel length (the minimum distance between the source region and the drain region) is 0.25 µm or less in a spin MOSFET having a lateral structure like the spin MOSFET of the third embodiment, the spin diffusion length becomes the same as the spin diffusion length in a spin MOSFET structure having in-plane magnetization films, and spin relaxation in the channel region due to a leakage magnetic field can be restrained.

Fourth Embodiment

Figure 7:
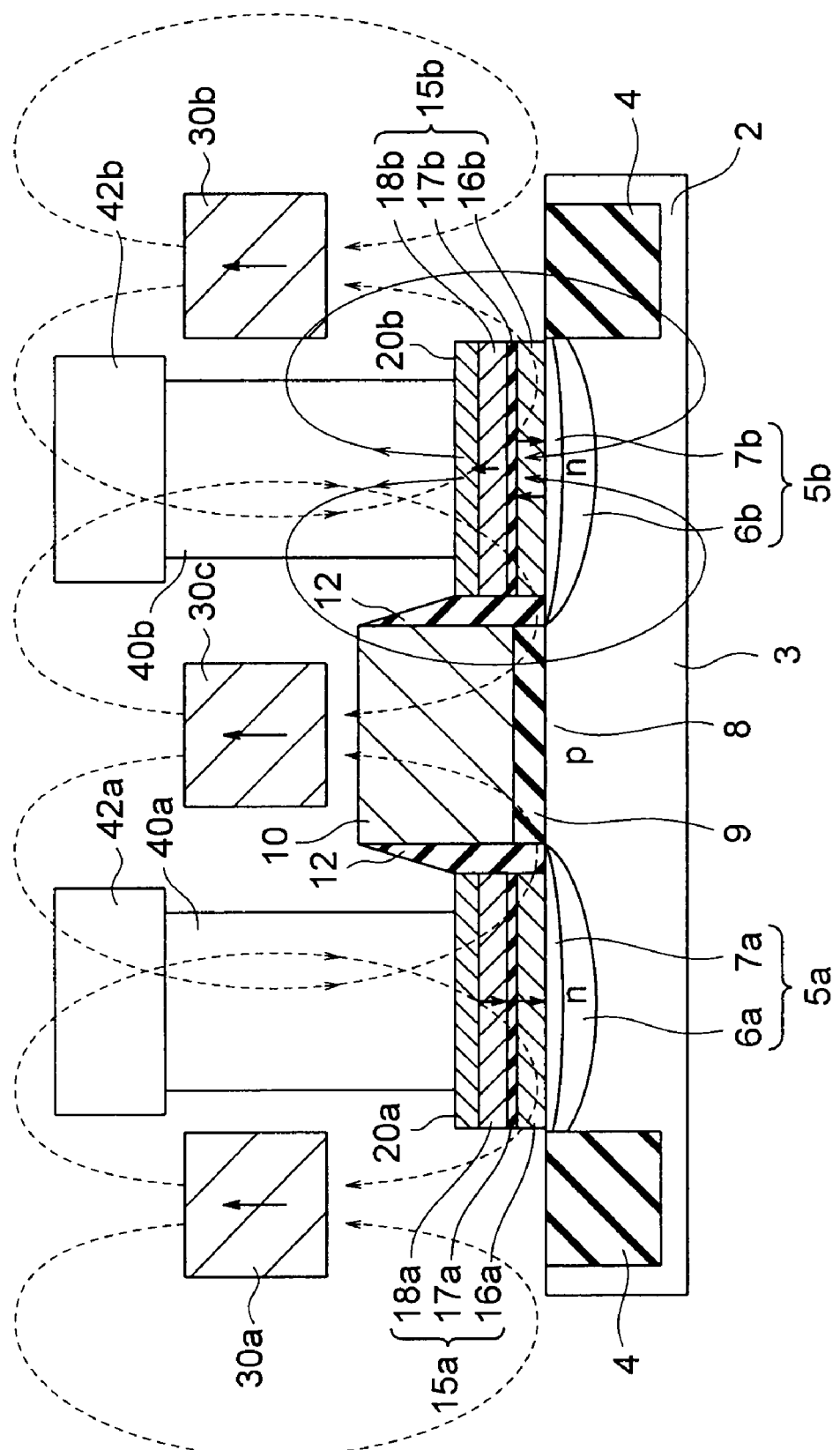
FIG. 7 is a cross-sectional view of a spin MOSFET according to a fourth embodiment.

FIG. 7 is a cross-sectional view of a spin MOSFET according to a fourth embodiment of the present invention. The spin MOSFET of the fourth embodiment is the same as the spin MOSFET of the third embodiment shown in FIG. 3, except that the tunnel barrier layers 14a and 14b are removed, and the source unit 15a is a MTJ that has a stacked structure in which a free layer 16a, a tunnel barrier layer 17a, and a fixed magnetization layer 18a are stacked in this order on the source region 5a.

Like the spin MOSFET of the third embodiment, the spin MOSFET of this embodiment can eliminate the influence of a leakage magnetic field on adjacent transistors, and enables shift adjustment. The channel length is made 0.25 µm or less, so that spin relaxation in the channel region can be restrained as in the third embodiment.

In the spin MOSFET of this embodiment, the area of the film plane of the ferromagnetic stacked film of the source unit 15a is made larger than the area of the film plane of the ferromagnetic stacked film of the drain unit 15b. With this arrangement, the magnetization direction of the ferromagnetic layer 16a of the source unit 15a is not varied by a write current, but the magnetization direction of the ferromagnetic layer 16b of the drain unit 15b is varied by a write current. Alternatively, the area of the film plane of the ferromagnetic stacked film of the source unit 15a may be made smaller than the area of the film plane of the ferromagnetic stacked film of the drain unit 15b.

With the above structure, only the free layer of the smaller-area ferromagnetic stacked film can be reversed at the time of spin injection writing. The write current $I_c$ for spin injection writing is represented by the following equation:

$$I_c = 2e\alpha MAt[H_k - H_d]/(hg) \quad (1)$$

where e represents the elementary charge, α represents the Gilbert damping parameters, M represents magnetization, A represents the area of the film plane of the magnetic recording layer (the free layer with the smaller area), t represents the film thickness of the magnetic recording layer (the free layer), $H_d$ represents the demagnetizing field, $H_k$ represents the anisotropic constant, and h represents the Planck's constant. Here, g represents the spin dependence efficiency g(θ) at the interface between a fixed magnetization layer and a nonmagnetic layer, and is expressed by the following equation:

$$g(\theta) = [-4 + (1+p)^3(3+\cos\theta)/4p^{3/2}]^{-1} \quad (2)$$

where p represents the spin polarization rate, and θ represents the angle formed by the magnetization directions of the two magnetic layers. Accordingly, the current that is spin-reversed by the free layer is proportional to the area of the film plane of the ferromagnetic stacked film. In this embodiment, the spin of the free layer of the ferromagnetic stacked film of either the source unit or the drain unit is to be reversed. Therefore, the areas of the film planes of the ferromagnetic stacked films of the source unit and the drain unit differ from each other, and the magnetization of the free layer of the ferromagnetic stacked film with the smaller area is always reversed first. The ratio between the areas of the film planes of the source unit 15a and the drain unit 15b is preferably 1.1 or higher, or more preferably 1.2 or higher, as will be shown in the below described Examples.

Figure 8:
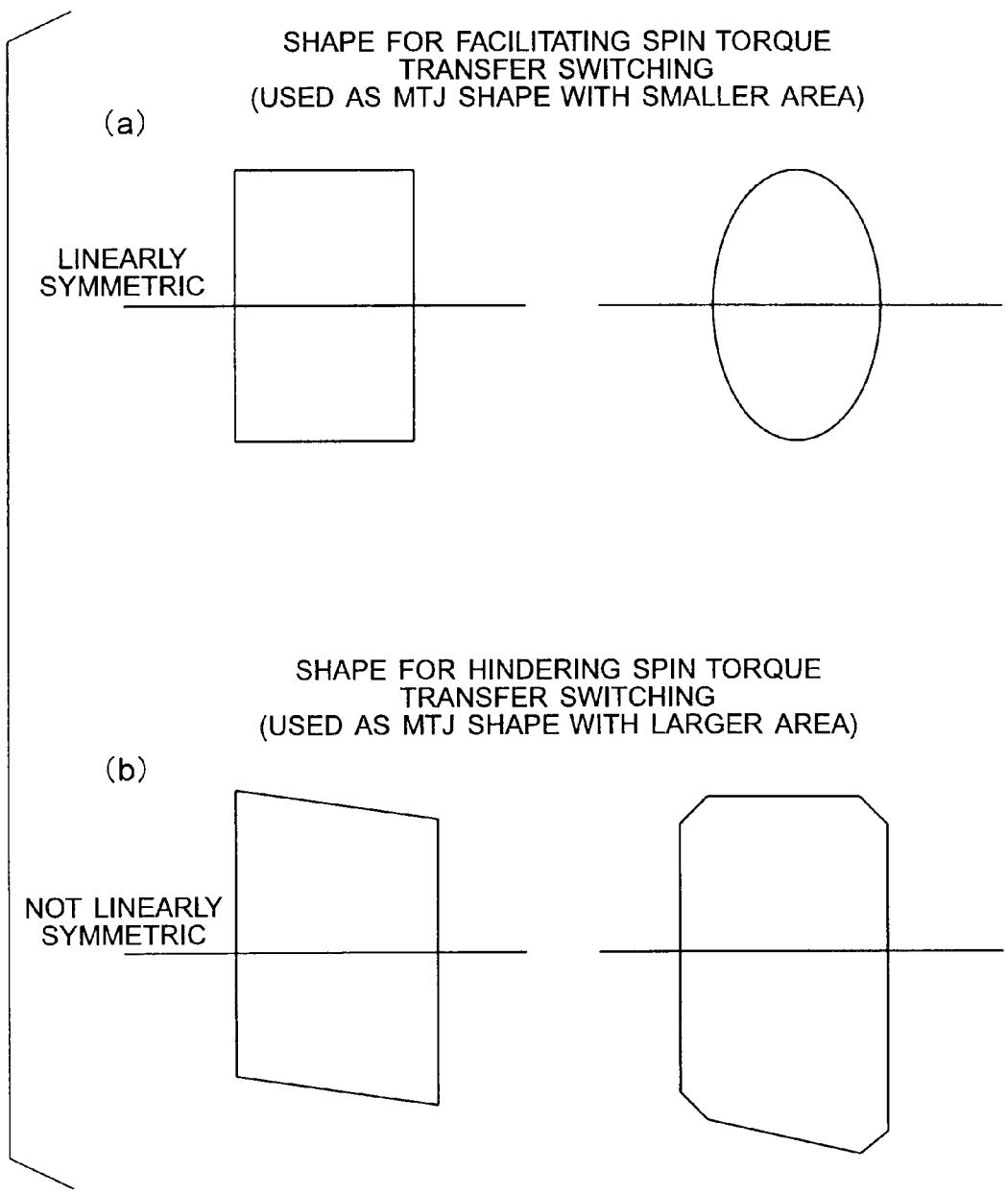
FIG. 8($a$) is a diagram for explaining an in-plane shape of a MTJ that easily has a magnetization reversal at the time of spin injection.

As shown in FIGS. 8(a) and 8(b), the margin at the time of spin injection writing becomes wider, where one of the ferromagnetic stacked films of the source unit 15a and the drain unit 15b has a linearly symmetric shape, and the other one has a linearly asymmetric shape. FIG. 8(a) shows an example of the linearly symmetric shape, and FIG. 8(b) shows an example of the linearly asymmetric shape. However, the present invention is not limited to the examples illustrated in FIGS. 8(a) and 8(b), and any linearly symmetric shape and linearly asymmetric shape may be used. It has become apparent that no problems are caused as long as the length ratio between the ferromagnetic stacked films is 1.1 or higher. The linearly symmetric shape is used for the ferromagnetic stacked film with the smaller-area film plane, and the linearly asymmetric shape is used for the ferromagnetic stacked film with the larger-area film plane.

Also, the spin directions of the free layer of the ferromagnetic stacked film with the larger area and the ferromagnetic layer in contact with the nonmagnetic layer (the tunnel barrier layer) of the fixed magnetization layer should preferably be parallel to each other. As can be seen from Equations (1) and (2), the write current $I_c$ in the case where the spin directions are parallel (cos θ=1) is larger than the write current $I_c$ in the case where the spin directions are antiparallel (cos θ=−1), and therefore, a spin reversal in the case of parallel spin directions is more difficult than a spin reversal in the case of antiparallel spin directions. The spin direction in the ferromagnetic stacked film with the larger area is always fixed, so as to avoid writing when the spin direction of the free layer of the ferromagnetic stacked film with the smaller area is rewritten. At this point, the spin directions are made parallel to each other, so that the resistance of the spin MOSFET of this embodiment can be lowered, and spin injection writing can be performed at a higher speed.

As described above, in the case of writing, the magnetization direction of the free layer of the ferromagnetic stacked film with the larger area of the source unit 15a and the drain unit 15b is not changed, but a current for reversing the magnetization direction of the free layer of the ferromagnetic stacked film with the smaller area is supplied to the spin MOSFET. In the case of reading, a current for not changing the magnetization directions of the free layers of the ferromagnetic stacked films of the source unit 15a and the drain unit 15b is supplied to the spin MOSFET. In doing so, the predetermined first voltage is applied to the gate 10, and a current flows between the source unit 15a and the drain unit 15b through the channel 8. Accordingly, reading can be performed by measuring the electric resistance between the source unit 15a and the drain unit 15b. Meanwhile, writing can be performed by applying the predetermined second voltage, different from the voltage for the reading, to the gate 10, and supplying a current between the source unit 15a and the drain unit 15b through the channel 8.

As described above, in this embodiment, the areas of the film planes of the source unit 15a and the drain unit 15b differ from each other, but the source unit 15a and the drain unit 15b have the same stacked structures as each other. Accordingly, increases in production costs can be restrained as much as possible.

In this embodiment, Schottky barriers are formed at the interface between the source unit 15a and the source region 5a, and at the interface between the drain unit 15b and the drain region 5b. However, the tunnel barrier layer 14a may be provided between the source unit 15a and the source region 5a, and the tunnel barrier layer 14b may be provided between the drain unit 15b and the drain region 5b. With the tunnel barrier layers 14a and 14b, the rate of magnetoresistance change via the semiconductor becomes higher. Also, the tunnel barrier layers 14a and 14b serve as the element diffusion barriers between the semiconductor and the ferromagnetic layers. In a case where a semiconductor and a ferromagnetic layer are connected directly to each other without a tunnel barrier layer, element diffusion is caused between the semiconductor and the ferromagnetic layer when the temperature rises to 400° C. or higher. As a result, the spin signal via the semiconductor might quickly deteriorate.

Fifth Embodiment

Figure 9:
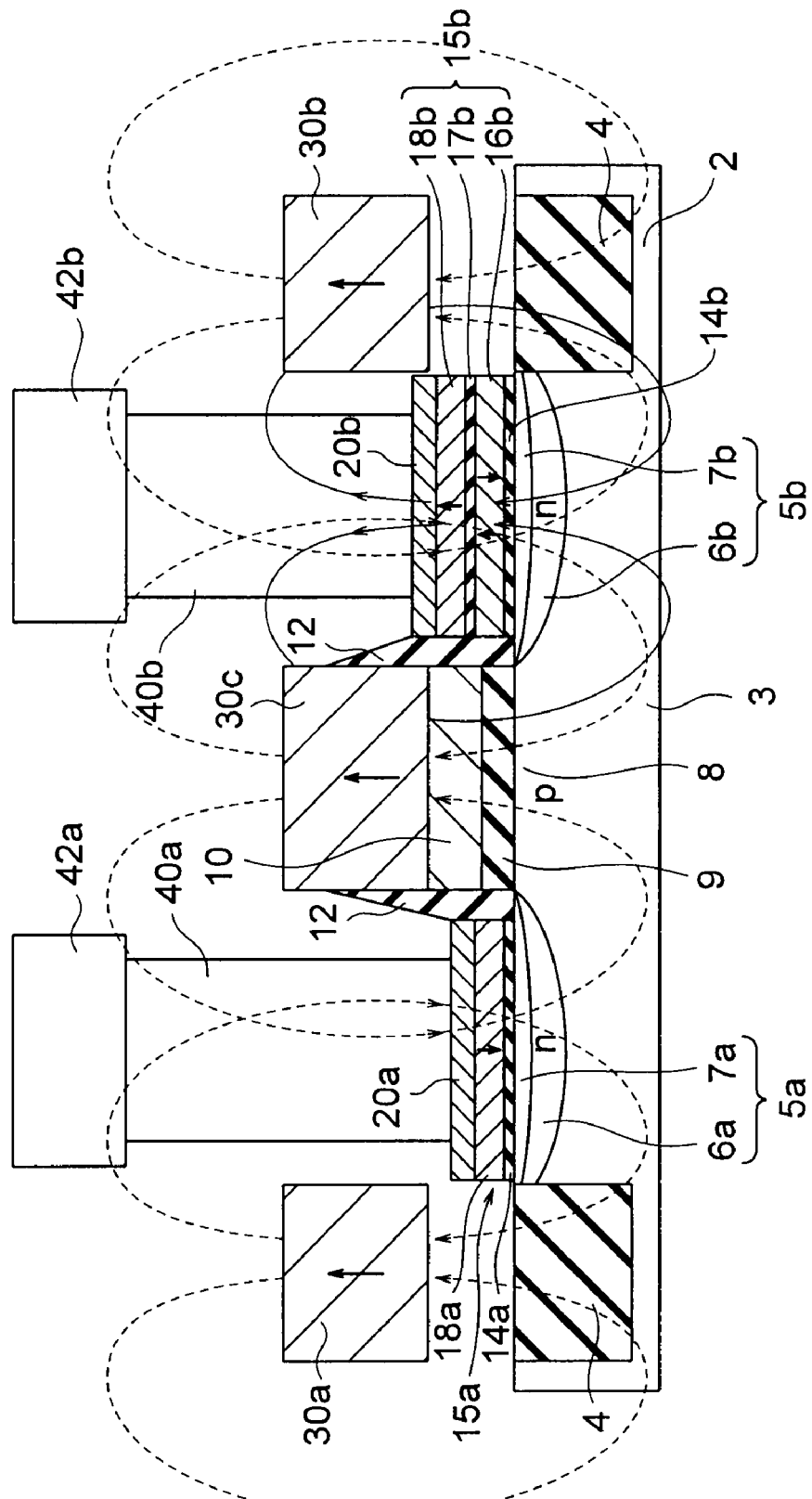
FIG. 9 is a cross-sectional view of a spin MOSFET according to a fifth embodiment.

FIG. 9 is a cross-sectional view of a spin MOSFET according to a fifth embodiment of the present invention. The spin MOSFET of the fifth embodiment is the same as the spin MOSFET of the third embodiment shown in FIG. 3, except that the hard bias film 30b is made closer to the free layer 16b of the drain unit 15b, to increase the magnitude of magnetic force generated from the hard bias film 30b. Therefore, the hard bias films 30a and 30c are also closer to the source unit 15a and the gate electrode 10, respectively. Particularly, the gate includes the hard bias film 30c made of a magnetic material and accounts for a half of the gate electrode 10 of the third embodiment. Accordingly, the gate has a stacked structure that is formed of a gate insulating film 9, the gate electrode 10 placed on the gate insulating film 9, and the hard bias film 30c placed on the gate electrode 10.

With this arrangement, the shift of the free layer 16b located below the fixed magnetization layer via the tunnel barrier layer 17b can be adjusted, and a bias magnetic field is applied in such a direction as to further stabilize thermally the magnetization direction of the fixed magnetization layer 18a placed on the opposite side of the gate from the drain unit 15b. Thus, this structure is a preferred structure.

Like the third embodiment, this embodiment can eliminate the influence of a leakage magnetic field on adjacent transistors, and enables shift adjustment. The channel length is made 0.25 μm or less, so that spin relaxation in the channel region can be restrained as in the third embodiment.

Sixth Embodiment

Figure 10:
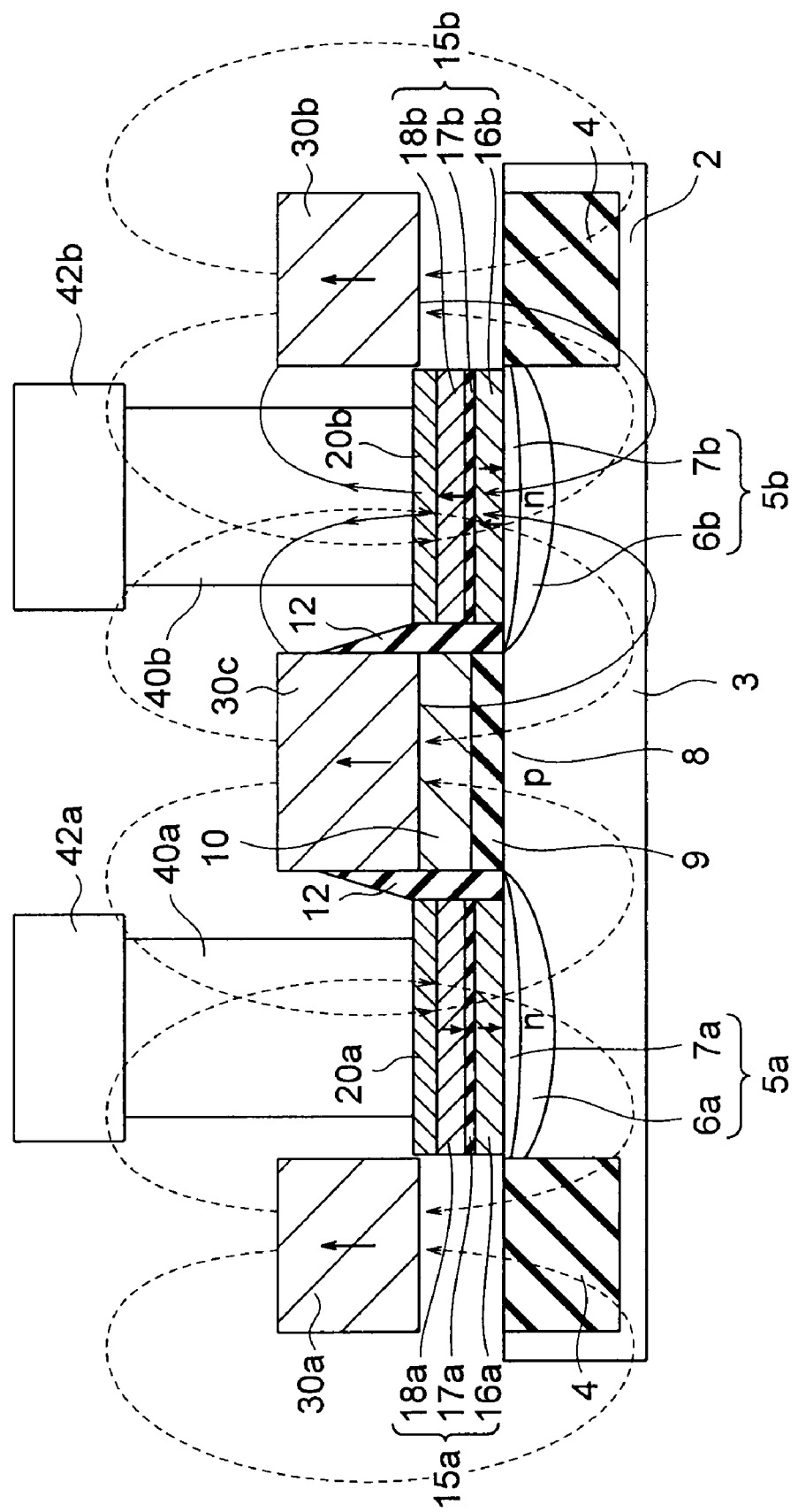
FIG. 10 is a cross-sectional view of a spin MOSFET according to a sixth embodiment of the present invention.

FIG. 10 is a cross-sectional view of a spin MOSFET according to a sixth embodiment of the present invention. The spin MOSFET of the sixth embodiment is the same as the spin MOSFET of the fourth embodiment shown in FIG. 7, except that the hard bias film 30b is made closer to the free layer 16b of the drain unit 15b, to increase the magnitude of magnetic force generated from the hard bias film 30b. Therefore, the hard bias films 30a and 30c are also closer to the source unit 15a and the gate electrode 10, respectively. Particularly, the gate includes the hard bias film 30c made of a magnetic material and accounts for a half of the gate electrode 10 of the second embodiment. Accordingly, the gate has a stacked structure that is formed of a gate insulating film 9, the gate electrode 10 placed on the gate insulating film 9, and the hard bias film 30c placed on the gate electrode 10.

With this arrangement, the shift of the free layer 16b located below the fixed magnetization layer via the tunnel barrier layer 17b can be adjusted, and a bias magnetic field is applied in such a direction as to further stabilize thermally the magnetization direction of the fixed magnetization layer 18a placed on the opposite side of the gate from the drain unit 15b. Thus, this structure is a preferred structure.

Like the fourth embodiment, this embodiment can eliminate the influence of a leakage magnetic field on adjacent transistors, and enables shift adjustment. The channel length is made 0.25 μm or less, so that spin relaxation in the channel region can be restrained as in the fourth embodiment.

Seventh Embodiment

Figure 11:
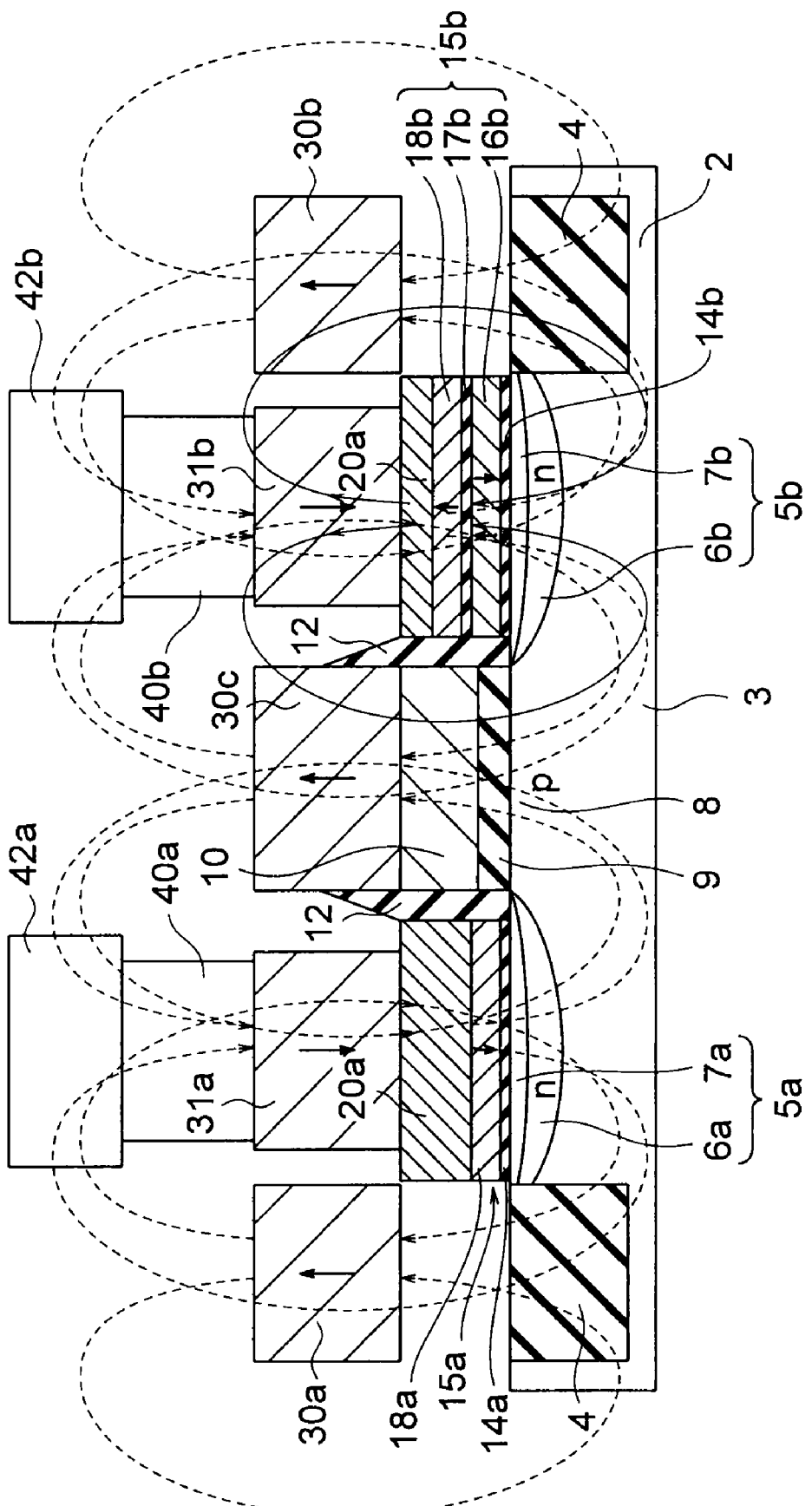
FIG. 11 is a cross-sectional view of a spin MOSFET according to a seventh embodiment of the present invention.

FIG. 11 is a cross-sectional view of a spin MOSFET according to a seventh embodiment of the present invention. The spin MOSFET of the seventh embodiment is the same as the spin MOSFET of the fifth embodiment shown in FIG. 9, except that the hard bias films 31a and 31b each having a magnetization direction substantially perpendicular to the film plane are provided on the nonmagnetic metal layers 20a and 20b placed on the source unit 15a and the drain unit 15b, respectively. Accordingly, the hard bias films 31a and 31b are provided at the contact positions of the source unit 15a and the drain unit 15b. The magnetization directions of the hard bias films 31a and 31b are the opposite from (antiparallel to) the hard bias films 30a, 30b, and 30c.

Like the fifth embodiment, this embodiment can eliminate the influence of a leakage magnetic field on adjacent transistors, and enables shift adjustment. The channel length is made 0.25 μm or less, so that spin relaxation in the channel region can be restrained as in the fifth embodiment. Also, a bias magnetic field is applied in such a direction as to further stabilize thermally the magnetization direction of the fixed magnetization layer 18a placed on the opposite side of the gate from the drain unit 15b. Thus, this structure is a preferred structure.

Further, in the third through sixth embodiments, a material such as Co—Pt, Co—Fe—Pt, CoPd, or Co—Fe—Pd is used as the material of the hard bias films. In the arrangement of the seventh embodiment, however, the restriction on the material of the hard bias films can be advantageously removed. This is because the hard bias films 30a, 30b, 30c, 31a, and 31b are placed close to one another, and the magnetic force lines spontaneously cancel one another as shown in FIG. 11, as the hard bias films make one another "not hard".

Eighth Embodiment

Figure 12:
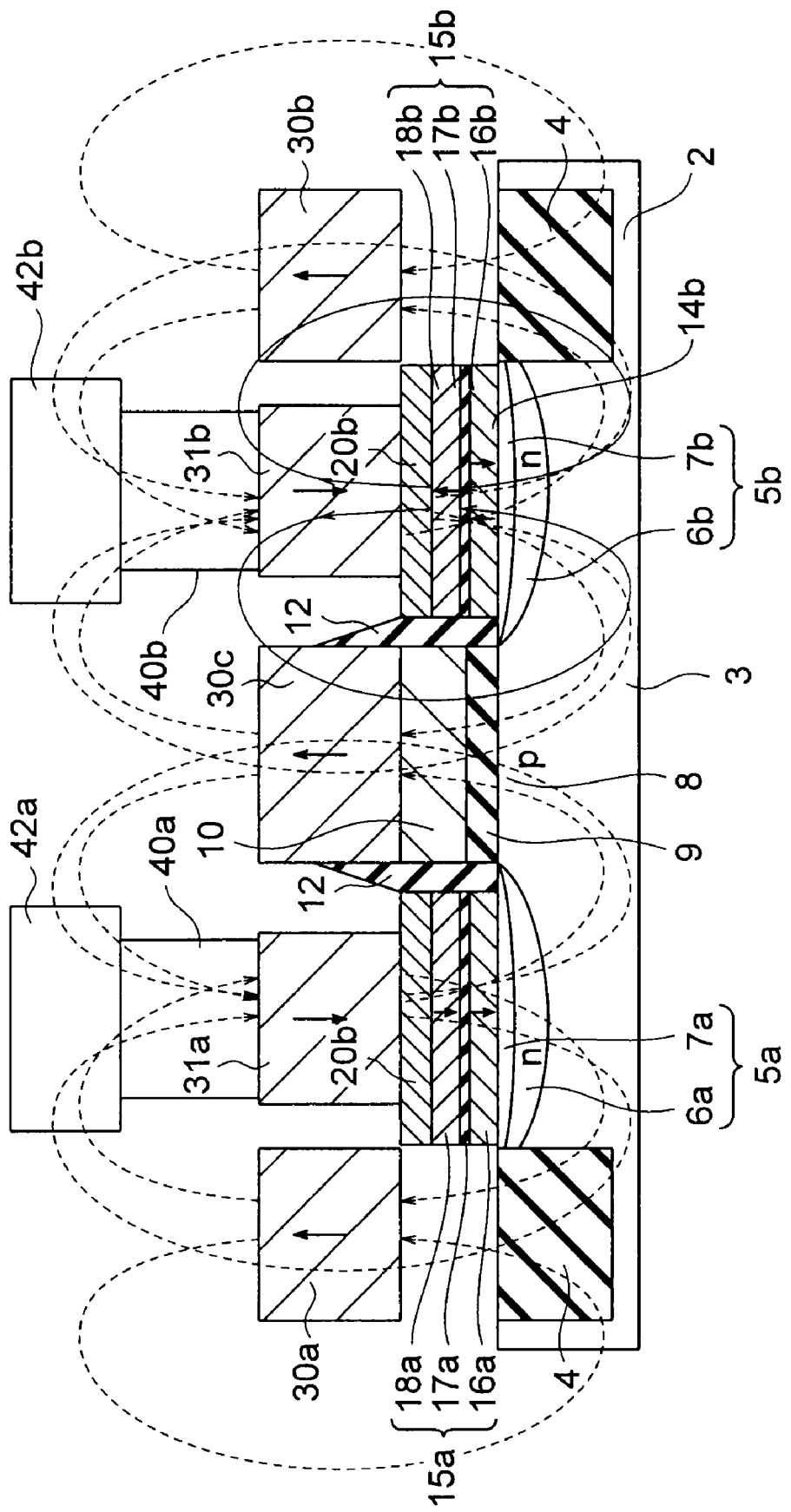
FIG. 12 is a cross-sectional view of a spin MOSFET according to an eighth embodiment of the present invention.

FIG. 12 is a cross-sectional view of a spin MOSFET according to an eighth embodiment of the present invention. The spin MOSFET of the eighth embodiment is the same as the spin MOSFET of the sixth embodiment shown in FIG. 10, except that the hard bias films 31a and 31b each having a magnetization direction substantially perpendicular to the film plane are provided on the nonmagnetic metal layers 20a and 20b placed on the source unit 15a and the drain unit 15b, respectively. Accordingly, the hard bias films 31a and 31b are provided at the contact positions of the source unit 15a and the drain unit 15b. The magnetization directions of the hard bias films 31a and 31b are the opposite from (antiparallel to) the hard bias films 30a, 30b, and 30c.

Like the sixth embodiment, this embodiment can eliminate the influence of a leakage magnetic field on adjacent transistors, and enables shift adjustment. The channel length is made 0.25 µm or less, so that spin relaxation in the channel region can be restrained as in the sixth embodiment. Also, a bias magnetic field is applied in such a direction as to further stabilize thermally the magnetization direction of the fixed magnetization layer 18a placed on the opposite side of the gate from the drain unit 15b. Thus, this structure is a preferred structure.

Further, in the third through sixth embodiments, a material such as Co—Pt, Co—Fe—Pt, CoPd, or Co—Fe—Pd is used as the material of the hard bias films. In the arrangement of this embodiment, however, the restriction on the material of the hard bias films can be advantageously removed. This is because the hard bias films 30a, 30b, 30c, 31a, and 31b are placed close to one another, and the magnetic force lines spontaneously cancel one another as shown in FIG. 12, as the hard bias films make one another "not hard".

Ninth Embodiment

Figure 13:
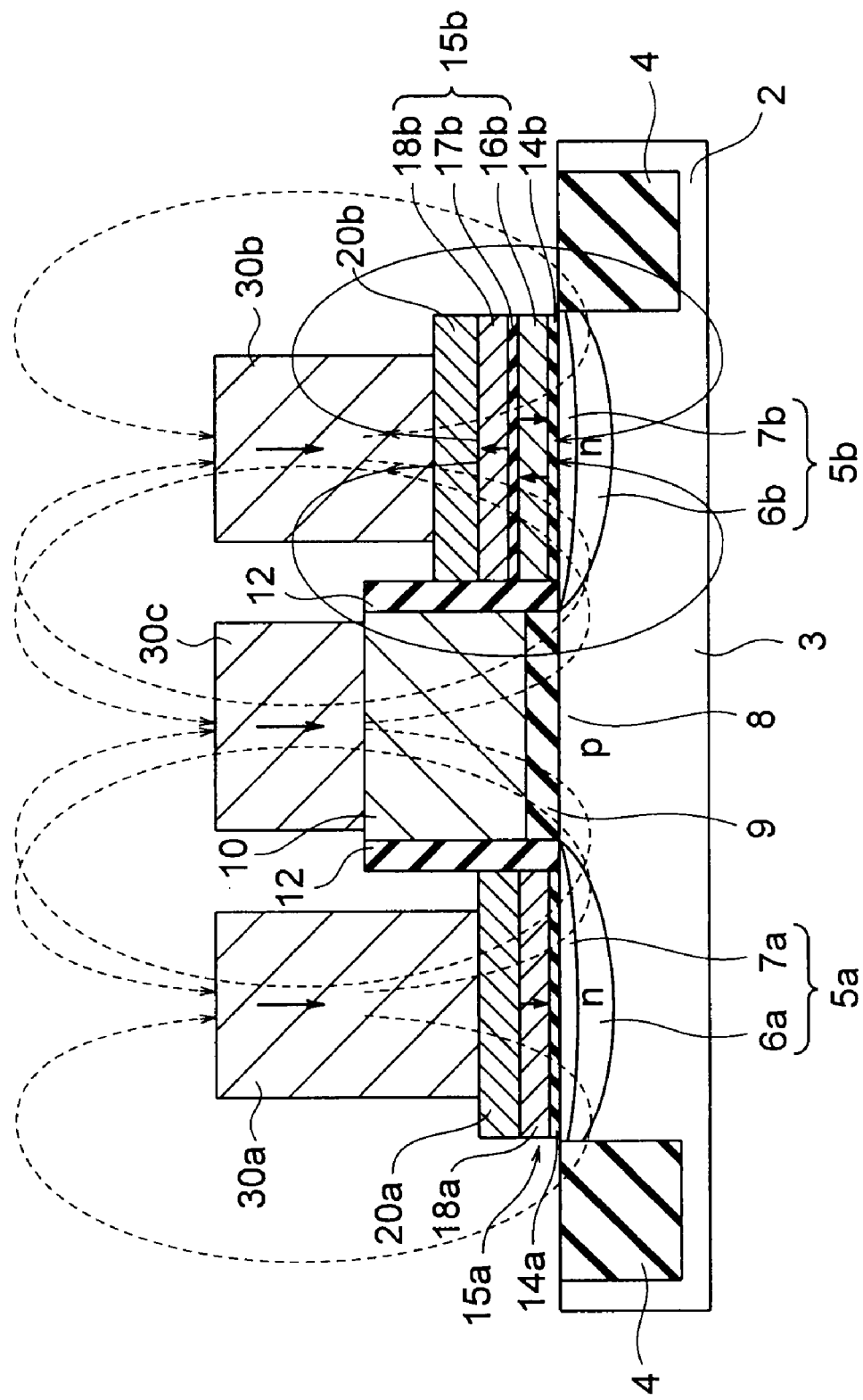
FIG. 13 is a cross-sectional view of a spin MOSFET according to a ninth embodiment of the present invention.

FIG. 13 is a cross-sectional view of a spin MOSFET according to a ninth embodiment of the present invention. The spin MOSFET of the ninth embodiment is the same as the spin MOSFET of the fifth embodiment shown in FIG. 9, except that the hard bias film 30b is made closer to the free layer 16b of the drain unit 15b so as to increase the influence of the magnetic force lines generated from the hard bias film 30b on the free layer 16b, and the hard bias film 30c is made farther from the channel region 8 so as to reduce the influence of the magnetic force lines generated from the hard bias film 30c on the channel region 8. Accordingly, the hard bias films 30a and 30b are formed on the nonmagnetic metal films 20a and 20b, and the hard bias film 30c is formed on the gate electrode 10 as high as the gate electrode 10 of the third embodiment. Here, the magnetization directions of the hard bias films 30a, 30b, and 30c are substantially parallel to one another, and are substantially antiparallel to the magnetization direction of the ferromagnetic layer 18b. With this magnetization arrangement, the magnetization of the ferromagnetic layer 16a of the source unit 15a can be stabilized, and the leakage magnetic field from the ferromagnetic layer 18b toward the free layer 16b in the drain 15b can be reduced. Also, the influence of the leakage magnetic fields from the hard bias films 30a, 30b, and 30c can be restrained in the channel 8. Accordingly, the shift of the free layer 16b located below the drain unit 15b via the tunnel barrier layer 17b can be adjusted, and a bias magnetic field is applied in such a direction as to further stabilize thermally the magnetization direction of the fixed magnetization layer 18a placed on the opposite side of the gate from the drain unit 15b. Thus, this structure is a preferred structure. Also, since the influence of the magnetic force lines from the bias film 30c on the channel region 8 is reduced, the adverse influence on the spin-polarized electrons passing through the channel region 8 can be reduced. The upper faces of the hard bias films 30a, 30b, and 30c are processed by CMP or the like, so as to exist in the same plane.

Like the third embodiment, this embodiment can eliminate the influence of a leakage magnetic field on adjacent transistors, and enables shift adjustment. The channel length is made 0.25 µm or less, so that spin relaxation in the channel region can be restrained as in the fifth embodiment.

The structure of this embodiment may be applied to the seventh and the eighth embodiments illustrated in FIGS. 11 and 12.

Tenth Embodiment

Figure 14:
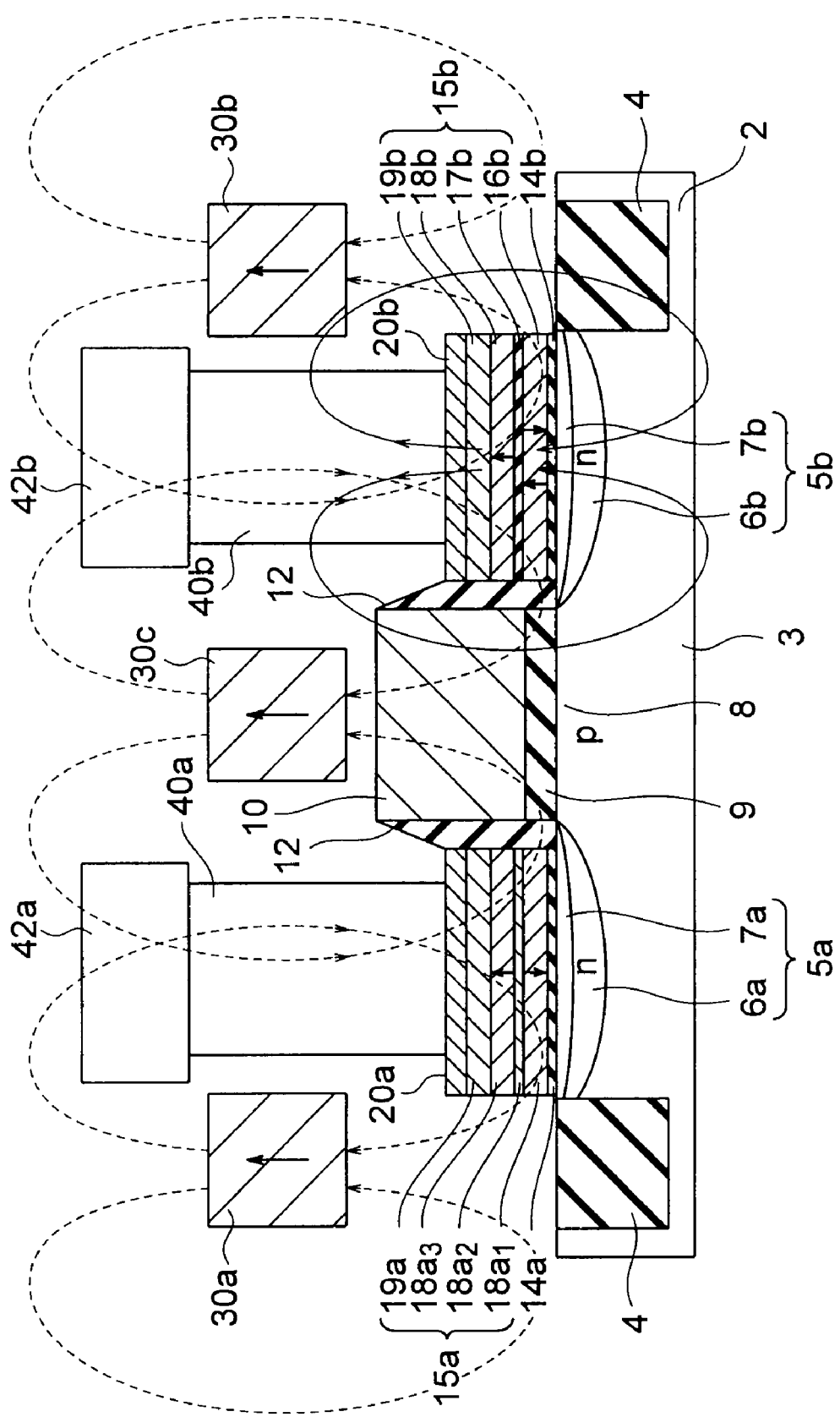
FIG. 14 is a cross-sectional view of a spin MOSFET according to a tenth embodiment of the present invention.

FIG. 14 is a cross-sectional view of a spin MOSFET according to a tenth embodiment of the present invention. The spin MOSFET of the tenth embodiment is the same as the spin MOSFET of the third embodiment shown in FIG. 3, except that the fixed magnetization layer 18a of the source unit 15a is replaced with a fixed magnetization layer that is a stacked structure in which a fixed magnetization film $18a_1$, a nonmagnetic film $18a_2$, and a fixed magnetization film $18a_3$ are stacked in this order. The magnetization directions of the fixed magnetization film $18a_1$ and the fixed magnetization film $18a_3$ are substantially perpendicular to the film plane, and are antiferromagnetically coupled to each other via the nonmagnetic film $18a_2$. In this embodiment, an antiferromagnetic layer 19a is provided between the fixed magnetization layer 18a of the source unit 15a and the nonmagnetic metal layer 20a, and an antiferromagnetic layer 19b is provided between the fixed magnetization layer 18b of the drain unit 15b and the nonmagnetic metal layer 20b. The magnetization direction of the fixed magnetization layer 18a of the source unit 15a becomes more stabilized by the antiferromagnetic layer 19a, and the magnetization direction of the fixed magnetization layer 18b of the drain unit 15b becomes more stabilized by the antiferromagnetic layer 19b. The nonmagnetic film $18a_2$ is made of Ru, Rh, or Ir, or an alloy of any of those materials.

As described above, the fixed magnetization layer 18a is a stacked structure, and antiferromagnetic layers are stacked on the respective fixed magnetization layers 18a and 18b. In this manner, the magnetization of the fixed magnetization layers 18a and 18b becomes more stabilized. As for the antiferromagnetic layers, it is preferable to use PtMn, Ir—Mn, FeMn, Pt—Cr—Mn, Ni—Mn, or the like.

Like the third embodiment, this embodiment can eliminate the influence of a leakage magnetic field on adjacent transistors, and enables shift adjustment. The channel length is made 0.25 µm or less, so that spin relaxation in the channel region can be restrained as in the third embodiment.

In this embodiment, the fixed magnetization layer 18b of the drain unit 15b may be replaced with a fixed magnetization layer that is a stacked structure formed of a fixed magnetization film, a nonmagnetic film, and another fixed magnetization film.

Eleventh Embodiment

Figure 15:
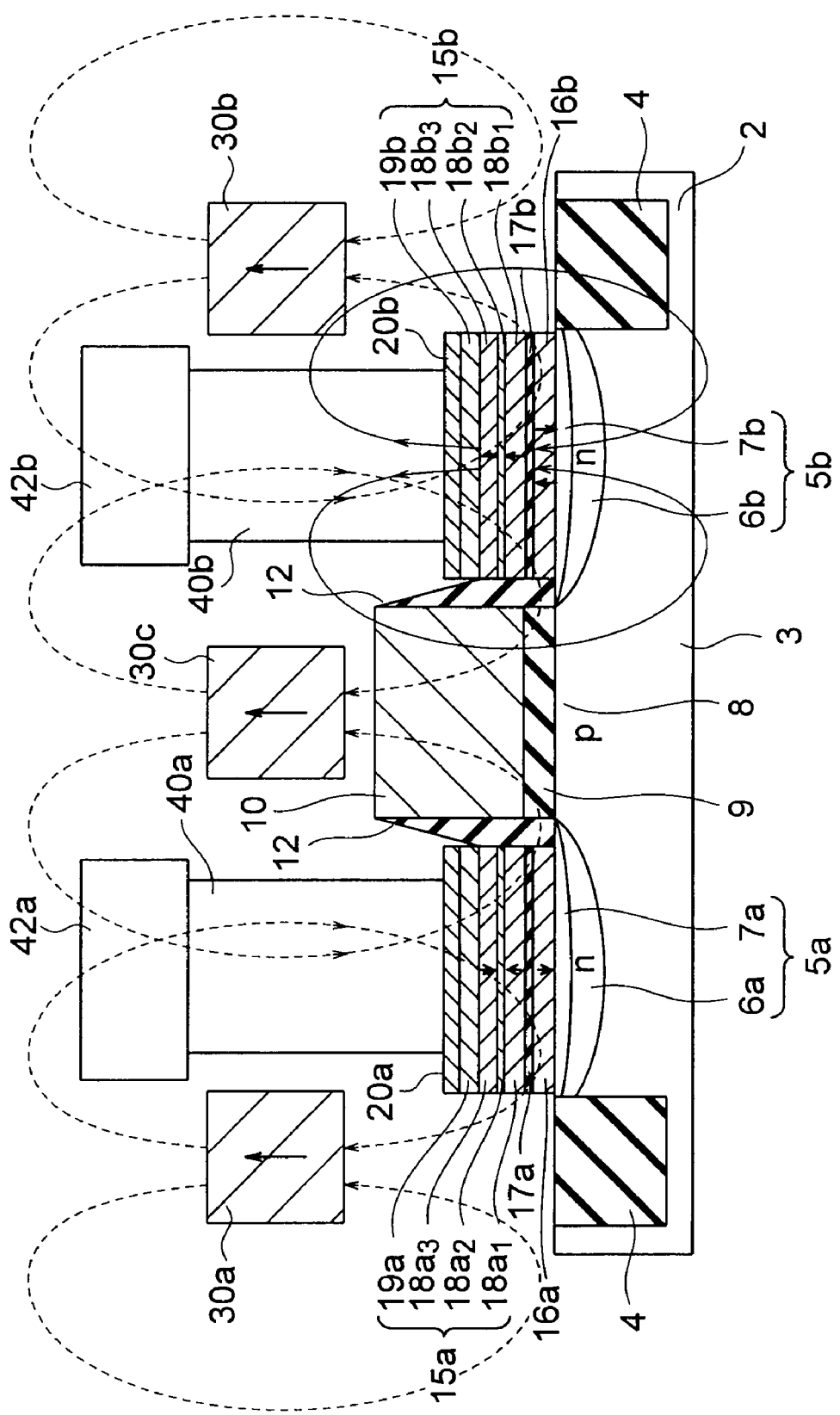
FIG. 15 is a cross-sectional view of a spin MOSFET according to an eleventh embodiment of the present invention.

FIG. 15 is a cross-sectional view of a spin MOSFET according to an eleventh embodiment of the present invention. The spin MOSFET of the eleventh embodiment is the same as the spin MOSFET of the fourth embodiment shown in FIG. 7, except that the fixed magnetization layer 18a of the source unit 15a is replaced with a fixed magnetization layer that is a stacked structure in which a fixed magnetization film $18a_1$, a nonmagnetic film $18a_2$, and a fixed magnetization film $18a_3$ are stacked in this order, and the fixed magnetization layer 18b of the drain unit 15b is replaced with a fixed magnetization layer that is a stacked structure in which a fixed magnetization film $18b_1$, a nonmagnetic film $18b_2$, and a fixed magnetization film $18b_3$ are stacked in this order. The magnetization directions of the fixed magnetization film $18a_1$ and the fixed magnetization film $18a_3$ are substantially perpendicular to the film plane, and are antiferromagnetically coupled to each other via the nonmagnetic film $18a_2$. The magnetization directions of the fixed magnetization film $18b_1$ and the fixed magnetization film $18b_3$ are substantially perpendicular to the film plane, and are antiferromagnetically coupled to each other via the nonmagnetic film $18b_2$. In this embodiment, an antiferromagnetic layer 19a is provided between the fixed magnetization layer 18a of the source unit 15a and the nonmagnetic metal layer 20a, and an antiferromagnetic layer 19b is provided between the fixed magnetization layer 18b of the drain unit 15b and the nonmagnetic metal layer 20b. The magnetization direction of the fixed magnetization layer 18a of the source unit 15a becomes more stabilized by the antiferromagnetic layer 19a, and the magnetization direction of the fixed magnetization layer 18b of the drain unit 15b becomes more stabilized by the antiferromagnetic layer 19b. The nonmagnetic films $18a_2$ and $18b_2$ are made of Ru, Rh, or Ir, or an alloy of any of those materials.

As described above, the fixed magnetization layers 18a and 18b are stacked structures, and antiferromagnetic layers are stacked on the respective fixed magnetization layers 18a and 18b. In this manner, the magnetization of the fixed magnetization layers 18a and 18b becomes more stabilized. As for the antiferromagnetic layers, it is preferable to use PtMn, Ir—Mn, FeMn, Pt—Cr—Mn, Ni—Mn, or the like.

Like the fourth embodiment, this embodiment can eliminate the influence of a leakage magnetic field on adjacent transistors, and enables shift adjustment. The channel length is made 0.25 μm or less, so that spin relaxation in the channel region can be restrained as in the fourth embodiment.

Twelfth Embodiment

Figure 16:
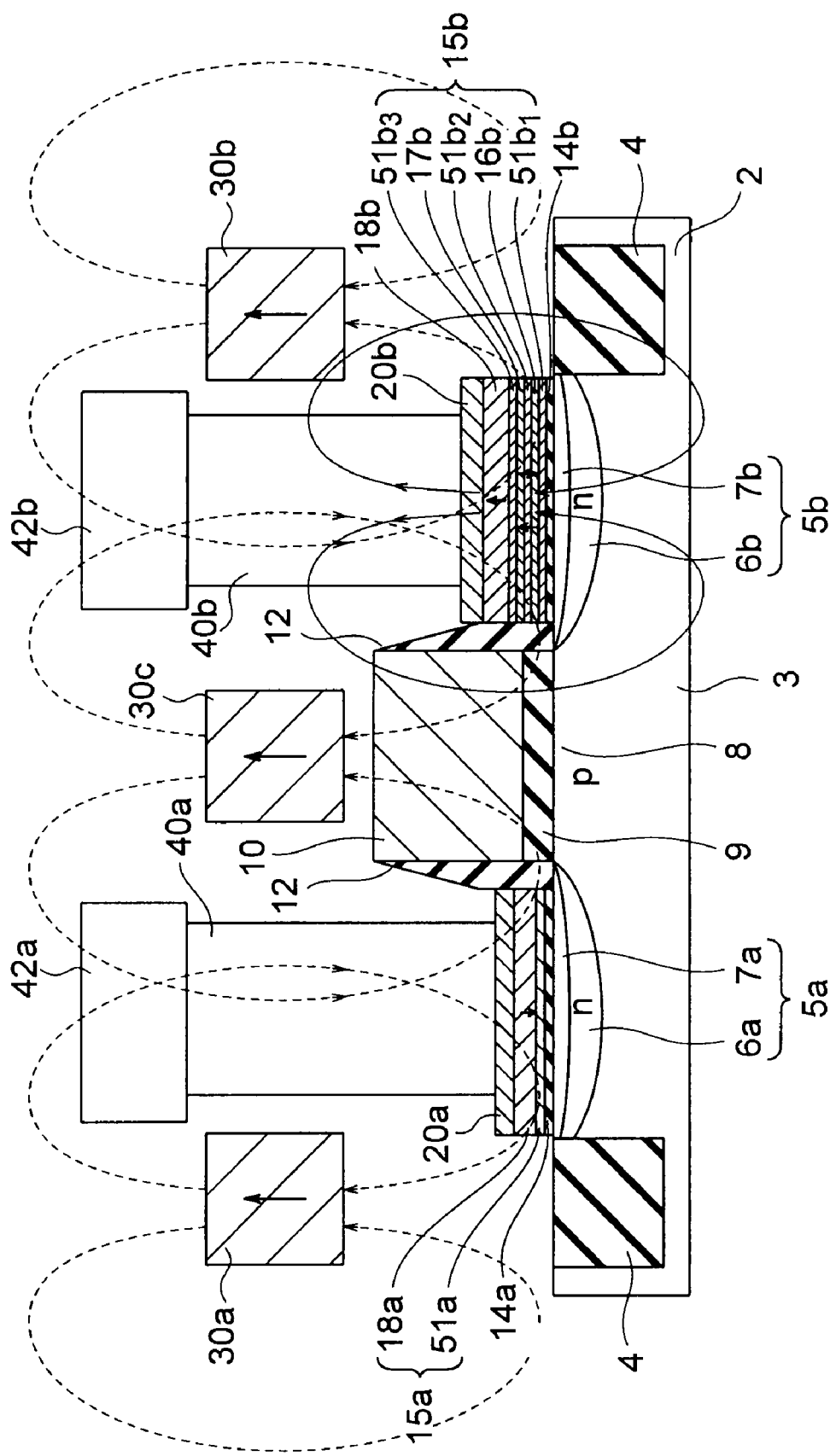
FIG. 16 is a cross-sectional view of a spin MOSFET according to a twelfth embodiment of the present invention.

FIG. 16 is a cross-sectional view of a spin MOSFET according to a twelfth embodiment of the present invention. The spin MOSFET of the twelfth embodiment is the same as the spin MOSFET of the third embodiment shown in FIG. 3, except that a Heusler alloy layer 51a is inserted between the tunnel barrier 14a and the fixed magnetization layer 18a of the source unit 15a, a Heusler alloy layer $51b_1$ is inserted between the tunnel barrier 14b and the free layer 16b, a Heusler alloy layer $51b_2$ is inserted between the free layer 16b and the nonmagnetic layer 17b, and a Heusler alloy layer $51b_3$ is inserted between the nonmagnetic layer 17b and the fixed magnetization layer 18b. As for the Heusler alloy layers, it is preferable to use a Co-based full-Heusler alloy having a high ferromagnetic transition temperature, such as $CO_2FeAl_xSi_{1-x}$ or $CO_2MnSi_xAl_{1-x}$.

As described above, a Heusler alloy layer is inserted between a tunnel barrier and a vertical magnetization layer, and a Heusler alloy layer is inserted between a vertical magnetization layer and a tunnel barrier (a nonmagnetic layer) in each vertical MTJ layer structure. With this arrangement, the MR value via the channel region and the MR value of each vertical MTJ can be increased. By changing the relative thickness ratio between the Heusler alloy layers and the vertical magnetization layers, the magnetization easy-axis direction can be shifted to the vertical direction as a whole. In this embodiment, the tunnel barriers 14a and 14b may be removed. The same effects as above can also be achieved, even if the Heusler alloy layers are replaced with CoFeB layers.

Like the third embodiment, this embodiment can eliminate the influence of a leakage magnetic field on adjacent transistors, and enables shift adjustment. The channel length is made 0.25 μm or less, so that spin relaxation in the channel region can be restrained as in the third embodiment.

The insertion of Heusler alloy layers or CoFeB layers may be applied to the fourth through eleventh embodiments.

As described above, with the use of any of the structures of the third through twelfth embodiments, the shift of a free layer located below a fixed magnetization layer via a tunnel barrier can be adjusted, and a bias magnetic field is applied in such a direction as to further stabilize thermally the magnetization direction of the fixed magnetization layer placed on the opposite side of the gate. Thus, a preferred structure can be obtained.

In the first through twelfth embodiments, examples of the materials of ferromagnetic layers having a spin easy axis direction perpendicular to the substrate in-plane preferably further include any one of a Fe—Pd layer, a Fe—Pt layer, a Fe—Pd—Pt layer, a Gd—Fe—Co layer, a Tb—Fe—Co layer, a Dy—Fe—Co layer, a Gd—Co layer, a Tb—Co layer, a Dy—Co layer, a multilayer of (Gd(—Fe)Co/Co(—Fe)—B)$_n$, a multilayer of (Tb(—Fe)Co/Co(—Fe)—B)$_n$, a multilayer of (Dy(—Fe)Co/Co(—Fe)—B)$_n$, a Co/Pd stacked film, a CoFe/Pd stacked film, a Co/Ni stacked film, a Fe/Pd stacked film, and a Fe/Pt stacked film. Incidentally, n means a number of layers in the multilayer.

In each of the spin MOSFETs of the first through ninth embodiments and the twelfth embodiment, a stacked film that is formed of a ferromagnetic stacked film having a nonmagnetic layer and vertical magnetization or is formed of an antiferromagnetic layer is stacked on at least one of the ferromagnetic bodies of the source unit and the drain unit, and the nonmagnetic layer is made of Ru, Rh, or Ir, or an alloy of any of those materials. With this arrangement, the spin of the fixed magnetization layers becomes more stabilized, and the stability of the fixed magnetization layers against heat becomes higher. Accordingly, even if miniaturization is carried out through scaling, smaller spin MOSFETs can be produced.

Each free layer (each magnetic recording layer) may have a stacked structure formed of a ferromagnetic layer, a nonmagnetic layer, and another ferromagnetic layer. If the nonmagnetic layers are made of Ru, Rh, or Ir, or an alloy of any of those materials in this case, the stability of each free layer becomes higher, and the stability of the magnetization easy axis at the time of writing becomes higher. Accordingly, even if miniaturization is carried out through scaling, smaller spin MOSFETs can be produced.

In each of the spin MOSFETs of the first through twelfth embodiments, the semiconductor substrate may be a Si substrate, a Ge substrate, SiGe substrate, a GaAs substrate, or an InGaAs substrate. It is preferable to form a p-n-p junction or an n-p-n junction in each of those substrates, and form a high-density $p^+$- or $n^+$-region at the interface between a ferromagnetic material and a semiconductor or the interface between the tunnel barrier and a semiconductor. With such a structure, the interfacial resistance between a semiconductor and a tunnel barrier, or a Schottky barrier, can be reduced. Thus, a higher-speed spin MOSFET can be realized. If n- or $n^+$-doping is performed on each interface in a case where the semiconductor substrate is made of Ge, the interfacial resistance can be made lower by inserting an oxide or nitride such as GeOx or GeNx under the tunnel barriers. If the semiconductor substrate is a GaAs substrate, it is preferable to insert InGaAs or the like under the tunnel barriers, so as to interfacial resistance.

In each of the first through twelfth embodiments, the tunnel barriers may be made of MgO, $SiO_2$, SiNx, AlOx, AlNx, GeOx, GeNx, GaOx, a rare-earth oxide, a rare-earth nitride, or a stacked film of one of those materials.

Although the spin MOSFETs according to the first through twelfth embodiments have been described in detail with reference to the drawings, the drawings are merely schematic, and the sizes of the components and the ratios in size among the components differ from those in reality. Also, the size or proportion of each component drawn in several drawings might vary among those drawings.

If the electric conductivity between the magnetic material and the semiconductor is high in each of the first through twelfth embodiments, the problem of conductance mismatching is caused, and the spin polarization is saturated. As a result, spin injection into the semiconductor cannot be performed. To solve this problem, ions are implanted into a semiconductor such as Si, Ge, or GaAs, and a p/n junction should preferably be formed as in a conventional MOSFET. In doing so, high-density ions are implanted into the interface between the semiconductor and the magnetic material or the tunnel barrier interface, and ($n^+$ or $p^+$) ions should preferably be segregated. More specifically, in an n- or p-type MOSFET using a Si or Ge semiconductor substrate, ion implantation of B (boron) is preferable as p-type impurity implantation, and ion implantation of P (phosphorus) or As (arsenic) is preferable as n-type impurity implantation. In the case of a GaAs substrate, an n-MOSFET is normally preferred, having higher mobility. In such a case, Si doping is normally performed. The accelerating voltage of the element to be ion-implanted in $n^+$-impurity regions or $p^+$-impurity regions is made as low as 20 KeV or lower, and high-density ion implantation should preferably be performed. In the case of a Si substrate, the same element can be used for n-type impurity regions and $n^+$-impurity regions, without a problem being caused. In the case of a Ge substrate, however, P (phosphorus) or As (arsenic) should be used in n-type impurity regions, and S (sulfur) should more preferably be used in $n^+$-impurity regions, so as to lower the resistance and obtain a high-speed device. After ion implantation, RTA (Rapid Thermal Annealing) is performed in $N_2$. The RTA temperature is in the range of 1000° C. to 1100° C. in the case of a Si substrate, and is in the range of 400° C. to 500° C. in the case of a Ge substrate. In the case of a GaAs substrate, RTA is performed in As at a temperature between 300° C. and 600° C., or Si doping during film formation is performed for growth. By any of those techniques, an excellent spin MOSFET can be realized, and spin-dependent conduction is observed.

EXAMPLES

The following is a description of examples of the present invention.

Example 1

Figure 17:
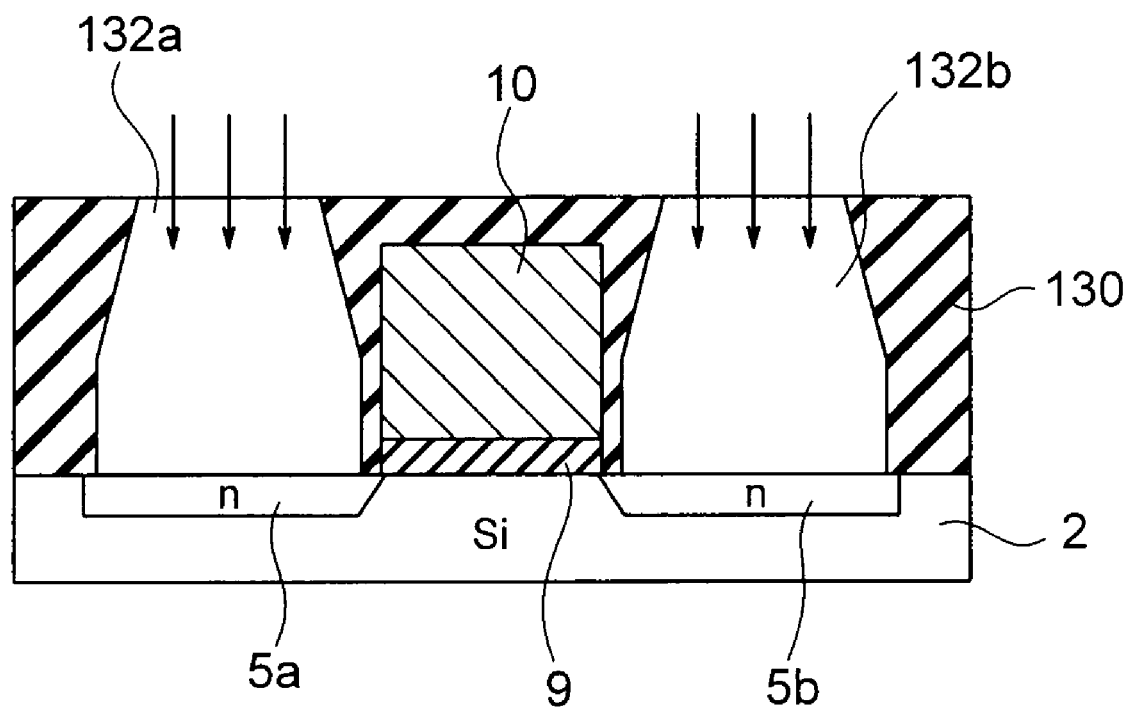
FIG. 17 is a cross-sectional view for explaining a manufacture method according to Example 1.

As Example 1, the spin MOSFET of the third embodiment illustrated in FIG. 3 is formed. In the spin MOSFET of Example 1, the areas of the ferromagnetic stacked films of the source unit 15a and the drain unit 15b differ from each other. The semiconductor substrate is formed of an implanted Si substrate. The spin MOSFET including the source unit 15a and the drain unit 15b having ferromagnetic stacked films with different areas from each other is formed in the following manner. First, as shown in FIG. 17, the source region 5a and the drain region 5b are formed at a distance from each other in the semiconductor substrate 2. The gate insulating film 9 is formed on the portion of the semiconductor substrate 2 located between the source region 5a and the drain region 5b. The gate electrode 10 is formed on the gate insulating film 9. Alternatively, the source region 5a and the drain region 5b may be formed after the gate insulating film 9 and the gate electrode 10 are formed. An interlayer insulating film 130 made of $SiO_2$ is then deposited to cover the gate electrode 10. Holes 132a and 132b having different areas from each other are formed in the interlayer insulating film 130. A ferromagnetic stacked film is deposited by high-pressure RF sputtering, to fill the holes 132a and 132b. The ferromagnetic stacked film deposited on the upper face of the interlayer insulating film is removed by CMP (Chemical Mechanical Polishing). In this example, the holds in the interlayer insulating film 130 are formed one by one, so as to form different stacked films. Since non-local measurement is to be also carried out, one of the device-isolating insulating films formed by LOCOS (Local Oxidation of Silicon) is located at a distance of 100 μm from the device, and the $n^+$-regions 7a and 7b, and n-regions 6a are designed to extend to the ohmic electrode located at a distance of 100 μm. The formation of the gate electrode, ion implantation, and RTA processing are performed in the same manner as in the formation of a conventional MOSFET. Etchback is then performed after the formation of the interlayer insulating film 130, and flattening is performed on the interlayer insulating film 130 to a certain degree, as shown in FIG. 17. The ferromagnetic stacked films of the source unit 15a and the drain unit 15b designed to have different areas but have the same aspect ratio are formed, thereby filling the holes. After the hole-filling film formation, CMP is performed. A $SiO_2$ film (not shown) is formed, and vias are opened. A wiring layer is then formed to fill the vias. Prior to the formation of the wiring, the areas of the source unit 15a and the drain unit 15b are measured by Shape SEM. The sizes of the holes 132a and 132b for the source unit 15a and the drain unit 15b are 0.8 μm×0.8 μm and 0.3 μm×0.8 μm, which are the planned sizes of the source unit 15a and the drain unit 15b. The shapes of the actual holes are oval. In this example, the holes 132a and 132b for the source unit 15a and the drain unit 15b may be the same as each other.

The stacked structures of the ferromagnetic stacked films 15a and 15b in this example are as follows.

The source unit 15a has a structure formed by stacking layers on the Si substrate 2 in the following order: the tunnel barrier 14a that is 0.8 nm in film thickness and is made of MgO, the ferromagnetic layer 18a formed of a 2.5-nm thick CoFeB layer and a 20-nm thick FePd layer, and the nonmagnetic metal layer 20a that is 50 nm in film thickness and is made of Ta. The drain unit 15b has a structure formed by stacking layers on the Si substrate 2 in the following order: the tunnel barrier 14b that is 0.8 nm in film thickness and is made of MgO, the free layer 16b formed of a 2.5-nm thick CoFeB layer, a 10-nm thick FePd layer, and a 2.5-nm thick CoFeB layer, the tunnel barrier 17b made of MgO, the ferromagnetic layer 18b formed of a 2.5-nm thick CoFeB layer and a 20-nm thick FePd layer, and the nonmagnetic metal layer 20b that is 50 nm in film thickness and is made of Ta.

After that, the wiring layer is formed, and the hard bias films 30a, 30b, and 30c are formed at the locations shown in FIG. 3. The hard bias films 30a, 30b, and 30c are made of CoPt.

As Comparative Example 1, a sample of a spin MOSFET is formed. This spin MOSFET is the same as the spin MOSFET of this example, except that the hard bias films 30a, 30b, and 30c are removed. After the formation of the samples of this example and Comparative Example 1, 300° C. annealing is performed in a magnetic field for one hour.

After that, magnetic field writing is performed to form a spin antiparallel state and a spin parallel state by a difference in coercive force between the magnetic materials of the source/drain, with the gate electrode being in an ON state.

Experiments are then carried out to read the rate of resistance change and measure the shift of each free layer.

Figure 18:
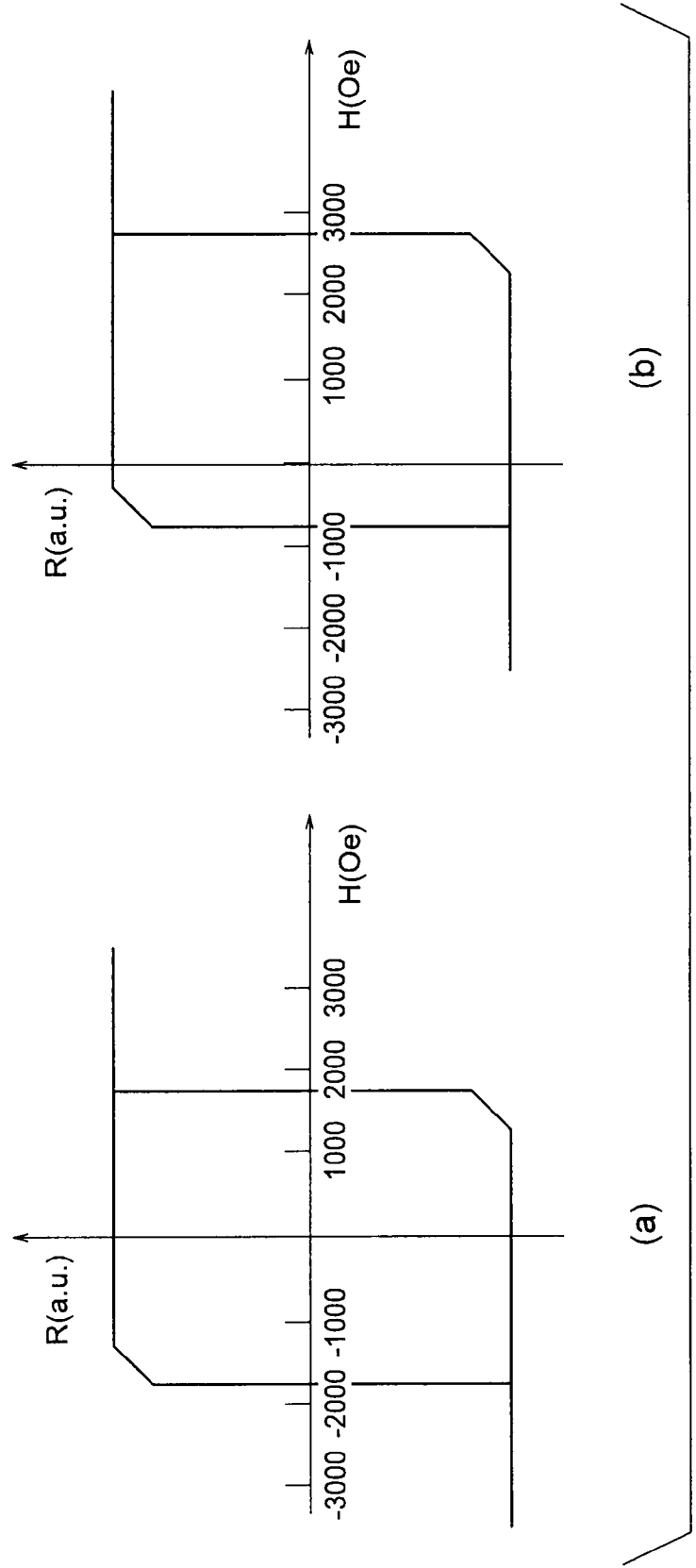
FIGS. 18($a$), 18($b$) show the results of measurement of the rate of resistance change and the shift amount in Example 1 and Comparative Example 1 respectively.

FIGS. 18(a) and 18(b) show the results of the experiments. As shown in FIG. 18(b), shift adjustment cannot be performed in Comparative Example 1. As shown in FIG. 18(a), shift adjustment can be performed by virtue of the hard bias films in this example. Also, as illustrated in FIG. 6, samples with different channel lengths are formed, and spin diffusion lengths are evaluated. The evaluations are made by measuring the sub spin current observed when the magnetization direction of the source unit and the drain unit are parallel to or antiparallel to each other. Since the channel length is 0.25 μm or less in this example, it is apparent that an effective structure is formed. The influence on adjacent cells is examined through magnetic field simulations. In this example, the magnetic layer of an adjacent spin MOSFET on the side of a free layer is a fixed magnetization layer. Accordingly, a bias magnetic field in such a direction as to further stabilize the spin is applied to the fixed magnetization layer, without a problem being caused, as mentioned above.

Example 2

A sample of a spin MOSFET of Example 2 is the same as the spin MOSFET of the seventh embodiment illustrated in FIG. 11, except that the Si substrate is replaced with a Ge substrate. The manufacture method is the same as that of Example 1.

The stacked structures of the ferromagnetic stacked films 15a and 15b in this example are as follows.

The source unit 15a has a structure formed by stacking layers on the Ge substrate in the following order: the tunnel barrier 14a formed of a 0.5-nm thick GeOx layer and a 0.5-nm thick MgO layer, the ferromagnetic layer 18a formed of a 2.5-nm thick CoFeB layer and a 20-nm thick FePd layer, and the nonmagnetic metal layer 20a formed of a 50-nm thick Ta layer. The drain unit 15b has a structure formed by stacking layers on the Ge substrate in the following order: the tunnel barrier 14b formed of a 0.5-nm thick GeOx layer and a 0.5-nm thick MgO layer, the free layer 16b formed of a 2.5-nm thick CoFeB layer, a 10-nm thick FePd layer, and a 2.5-nm thick CoFeB layer, the tunnel barrier 17b made of MgO, the fixed magnetization layer 18b formed of a 2.5-nm thick CoFeB layer and a 20-nm thick FePd layer, and the nonmagnetic metal layer 20b formed of a 50-nm thick Ta layer.

After that, the wiring layer is formed, and the hard bias films 30a, 30b, 30c, 31a, and 31b are formed at the locations shown in FIG. 11. The hard bias films are made of CoPt. Also, a sample is formed as Comparative Example 2, and this sample is the same as the sample of this example, except that the hard bias films are removed. After the formation of the samples of this example and Comparative Example 2, 270° C. annealing is performed in a magnetic field for one hour.

After that, magnetic field writing is performed to form a spin antiparallel state and a spin parallel state by a difference in coercive force between the magnetic materials of the source and drain, with the gate being in an ON state. Experiments are then carried out to read the rate of resistance change and measure the shift of each free layer.

Figure 19:
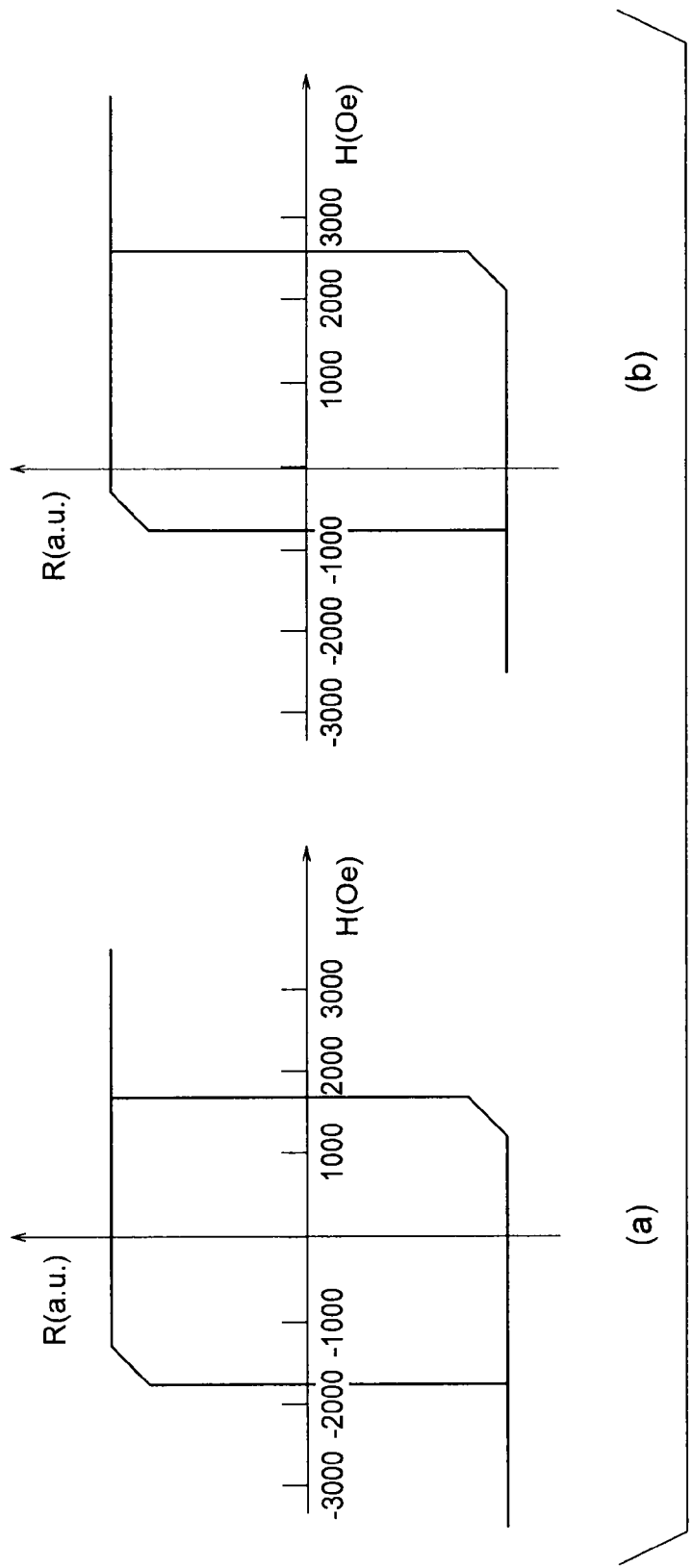
FIGS. 19($a$), 19($b$) show the results of measurement of the rate of resistance change and the shift amount in Example 2 and Comparative Example 1 respectively.

FIGS. 19(a) and 19(b) show the results of the experiments. As shown in FIG. 19(b), shift adjustment cannot be performed in Comparative Example 2. As shown in FIG. 19(a), shift adjustment can be performed by virtue of the hard bias films in this example. This proves that the same effects can be achieved with different kinds of semiconductors. The influence on adjacent cells is examined through magnetic field simulations. In this example, the magnetic layer of an adjacent spin MOSFET on the side of a free layer is a fixed magnetization layer. Accordingly, a bias magnetic field in such a direction as to further stabilize the spin is applied to the fixed magnetization layer, without a problem being caused, as mentioned above.

Example 3

A sample of a spin MOSFET of Example 3 is the same as the spin MOSFET of the fifth embodiment illustrated in FIG. 9, except that the Si substrate is replaced with a GaAs substrate. The manufacture method is the same as that of Example 1.

The stacked structures of the ferromagnetic stacked films 15a and 15b in this example are as follows.

The source unit 15a has a structure formed by stacking layers on the GaAs substrate in the following order: a 1.5-nm thick InGaAs layer, a 0.7-nm thick GaOx layer, the ferromagnetic layer 18a formed of a 2.5-nm thick CoFeB layer and a 20-nm thick FePd layer, and the nonmagnetic metal layer 20a formed of a 50-nm thick Ta layer. The drain unit 15b has a structure formed by stacking layers on the GaAs substrate in the following order: a 1.5-nm thick InGaAs layer, a 0.7-nm thick GaOx layer, the free layer 16b formed of a 2.5-nm thick CoFeB layer, a 10-nm thick FePd layer, and a 2.5-nm thick CoFeB layer, the tunnel barrier 17b formed of a 0.8-nm thick MgO layer, the fixed magnetization layer 18b formed of a 2.5-nm thick CoFeB layer and a 20-nm thick FePd layer, and the nonmagnetic metal layer 20b formed of a 50-nm thick Ta layer.

After that, the wiring layer is formed, and the hard bias films 30a, 30b, and 30c are formed at the locations shown in FIG. 9. The hard bias films are made of CoPt. Also, a sample is formed as Comparative Example 3, and this sample is the same as the sample of this example, except that the hard bias films are removed. After the formation of the samples of this example and Comparative Example 3, 300° C. annealing is performed in a magnetic field for one hour.

After that, magnetic field writing is performed to form a spin antiparallel state and a spin parallel state by a difference in coercive force between the magnetic materials of the source and drain, with the gate being in an ON state. Experiments are then carried out to read the rate of resistance change and measure the shift of each free layer. The results of the experiments are the same as those of Examples 1 and 2. Those results show that shift adjustment is enabled by the hard bias films. Those results also prove that the same effects can be achieved with different kinds of semiconductors. The influence on adjacent cells is examined through magnetic field simulations. In this example, the magnetic layer of an adjacent spin MOSFET on the side of a free layer is a fixed magnetization layer. Accordingly, a bias magnetic field in such a direction as to further stabilize the spin is applied to the fixed magnetization layer, without a problem being caused, as mentioned above.

Example 4

As Example 4, the spin MOSFET according to the second embodiment illustrated in FIG. 2 is formed on a Si substrate.

In this example, layers are stacked on the (001) Si substrate 61 in the following order: the buried oxide film (BOX) 62; the GOI (Germanium On Insulator) layer 63; the base layer 65 formed of a 0.6-nm thick MgO layer, a 3-nm thick CoFeB layer, and a 10-nm TiN layer; the stacked film 72 formed of a FePd layer and a Heusler alloy layer made of $CO_2FeAl_{0.5}Si_{0.5}$; the tunnel barrier 73 formed of a 0.8-nm thick MgO layer; the Ge channel layer 74; the tunnel barrier 77 formed of a 0.8-nm thick MgO layer; the free layer 78 formed of a Heusler alloy layer made of $Co_2FeAl_{0.5}Si_{0.5}$, a FePd layer, and a CoFeB layer; the tunnel barrier 80 formed of a 0.8-nm thick MgO layer; and the magnetic stacked film 82 formed of a CoFeB layer and a FePt layer. The gate insulting film 90a and the gate electrode 76 are formed on the sides of the channel layer 74.

The manufacture method according to this example is now described. First, a 150-nm thick $Si_{0.9}Ge_{0.1}$ crystalline layer and a 5-nm thick Si cap layer are grown on a SOI substrate having a 20-nm thick SOI layer by UHV-CVD (Ultra-High Vacuum Chemical Vapor Deposition) or MBE (Molecular Beam Epitaxy) or LP-CVD (Low Pressure Chemical Vapor Deposition). At this point, each film thickness is less than the critical film thickness at the growth temperature, and therefore, dislocation is not caused.

This wafer is then put into an oxidation furnace, and oxidation with the use of an oxygen gas diluted 50% with nitrogen is performed at 1000° C., until the thickness of the SiGe crystalline layer becomes 25 nm. Through this oxidation, Ge atoms are sufficiently diffused in the crystalline layer interposed between a buried oxide film (the lower layer) and a thermally-oxidized film (the upper layer). However, since an additional oxide film is not formed, the Ge density is increased to 70% as the thickness of the crystalline layer becomes smaller in the course of thermal oxidation. At this point, attention should be paid so that the oxidation temperature does not exceed the melting point of the SiGe with the increased Ge density. To obtain a SeGe layer with Ge density of 70% as in this example, the oxidation temperature should be 1025° C. or lower at the end. To effectively shorten the oxidation time, the temperature is first set at a high temperature that is not higher than the melting point according to the Ge density in the SiGe layer, and the temperature is lowered gradually or stepwise.

After surface cleaning, a 0.6-nm thick MgO layer is formed, and a 3-nm thick CoFeB layer is formed on the MgO layer. Annealing is then performed to cause crystallization, and a 20-nm thick TiN layer is formed. The MgO layer, the CoFeB layer, and the TiN layer constitute the base layer 65.

After surface cleaning, the stacked film 72 formed of a 20-nm thick FePd layer and a 4-nm thick Heusler alloy layer made of $Co_2FeAl_{0.5}Si_{0.5}$, the tunnel barrier 73 made of MgO, the Ge channel layer 74, the tunnel barrier 77 made of MgO, the free layer formed of a 3-nm thick Heusler alloy layer made of $Co_2FeAl_{0.5}Si_{0.5}$, a 10-nm thick FePd layer, and a 2.5-nm thick CoFeB layer, the tunnel barrier 80 formed of a 1.0-nm thick MgO layer, the magnetic stacked film 82 consisting of: a 2.5-nm thick CoFeB layer; a magnetic layer formed of a 20-nm thick FePt layer; a 0.9-nm thick Ru layer; and a 30-nm thick FePt layer, and the 100-nm thick Ta layer 84 are stacked in this order by sputtering.

As for the crystalline material of the semiconductor layer 74 to be the channel, it is possible to select a III-V compound semiconductor such as GaAs, other than Ge. If the base crystals are Ge, a III-V compound such as GaAs can be stacked without dislocation or the like, having a lattice constant relatively close to the lattice constant of Ge. It is also possible to select semiconductor crystals with different lattice constants on purpose, and improve the mobility of the channel by causing distortion in the channel portion. It is of course possible to select SiGe or Si as the crystalline material of the semiconductor layer 74 to be the channel.

After a protection film such as a deposited oxide film is inserted to the surface, a photoresist pattern is formed, and RIE is performed on the 100-nm Ta layer 84. With this Ta layer 84 serving as a hard mask, etching is performed on the upper magnetic stacked film and the Ge crystalline layer 74 to have island-like shapes by RIE. The etching should be stopped at the point when the Ge crystalline layer 74 is etched off, the etching of the base magnetic layer 72 is completed, and etching of the base layer 65 has just been started.

A thin insulating layer of 2 nm in thickness is then deposited on the entire surface by CVD. Here, $SiO_2$ is used. Part of this insulating layer turns into the gate insulating film. As the gate insulating film, it is possible to use not only a Si oxide film ($SiO_2$), but also a Si nitride film ($Si_3N_4$), a Si oxynitride film ($SiO_xN_y$), or a high-dielectric gate insulating film made of $Al_2O_3$, $Ta_2O_5$, $TiO_2$, $Ya_2O_3$, or the like. Other than those materials, a Ge nitride film can also be used as the gate insulating film. A Ge nitride film can be obtained through deposition by CVD, direct nitridation of a Ge surface with the use of an ammonia gas or a nitrogen gas, or the like.

After a polycrystalline Si layer of 20 nm to 25 nm in thickness for the gate electrode is deposited on the entire surface, phosphorus ion implantation is performed with a dose amount of $5\times10^{15}\,cm^{-2}$. Annealing is further performed, to turn the polycrystalline Si layer into a high-density n-type layer. Alternatively, dopant may be added at the same time as the deposition of the polycrystalline Si layer, and a low-resistance gate electrode may be formed by CVD. Also, a metal-based gate electrode may be used. The gate electrode has such a shape as to surround the channel portion of the vertical transistor. The polycrystalline Si layer deposited on the source/drain portions of the uppermost layer is removed by flattening. The polycrystalline Si layer is then removed by photolithography, remaining only at the portion surrounding the gate.

Lastly, the lower and upper magnetic layers are formed, and an opening for the polycrystalline Si electrode is formed. The electrode is then formed, thereby completing the device. After the formation of the sample, annealing is performed at 270° C. in a magnetic field for one hour. After that, magnetic field writing is performed to form a spin antiparallel state and a spin parallel state by a difference in coercive force between the magnetic materials of the source and drain, with the gate being in an ON state. An experiment is then carried out to read the rate of resistance change and measure the shift of each free layer. The results of the experiment show that shift adjustment is enabled, as in Examples 1 through 3. The influence on adjacent cells is examined through magnetic field simulations. In this example, even where the channel length is 20 nm, influence on adjacent cells is eliminated if a synthetic structure is used for the fixed magnetization layer of the vertical FET structure illustrated in the first and second embodiments.

Figure 20:
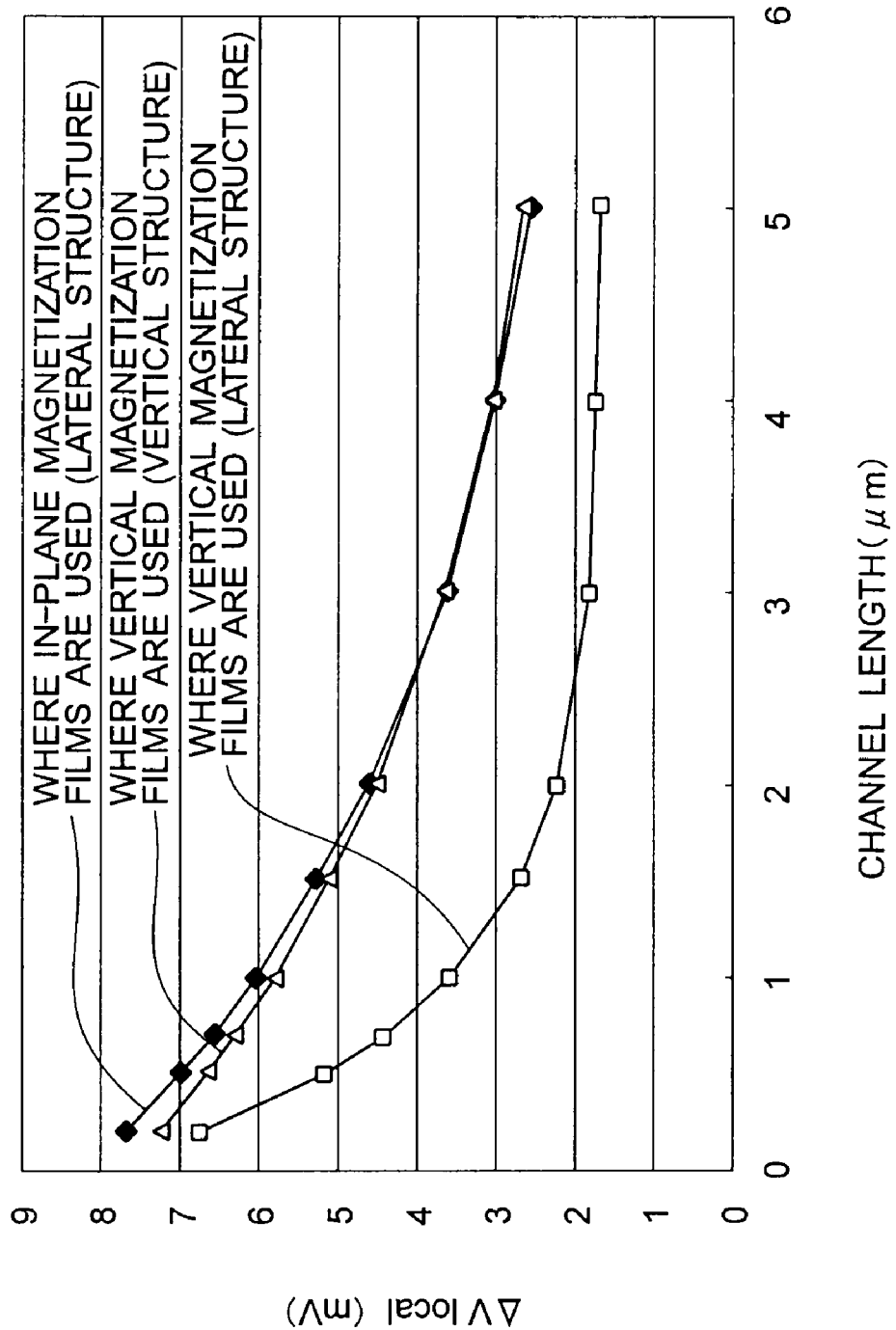
FIG. 20 shows the channel length dependence of the spin diffusion length in the channel region in Example 4.

FIG. 20 shows the channel length dependence of the output voltage difference ΔVlocal between a case where the spins in magnetic bodies are in a parallel state and a case where the spins in the magnetic bodies are in an antiparallel state in samples of vertical FET structures (vertical structures) in which the channel length varies from 20 nm to 500 nm. In FIG. 20, a case where a lateral FET (a lateral structure) has a Ge layer as the channel and has in-plane magnetization films in the magnetic material, and a case where a lateral FET has vertical magnetization films are also plotted. The magnetic materials and structures are the same as those explained with reference to FIG. 6. As can be seen from FIG. 20, the direction of the leakage magnetic field is parallel to the current flowing direction in the vertical FET structure. Accordingly, spin relaxation due to a Hanle effect is restrained, and preferred results are achieved in the vertical FET structure.

Next, an embodiment concerning a reconfigurable logic circuit formed of spin MOSFETs of the above embodiments and examples is described.

Thirteenth Embodiment

A reconfigurable logic circuit according to a thirteenth embodiment of the present invention is described. The reconfigurable logic circuit of this embodiment is a logic circuit formed of spin MOSFETs according to one of the first through twelfth embodiments and Examples 1 through 4.

First, a circuit structure actually used in a reconfigurable logic circuit is briefly described. In a case where a reconfigurable logic circuit is actually formed of spin MOSFETs, two MOSFETs (MOSFET 1 and MOSFET 2) preferably have a common floating gate.

Figure 21:
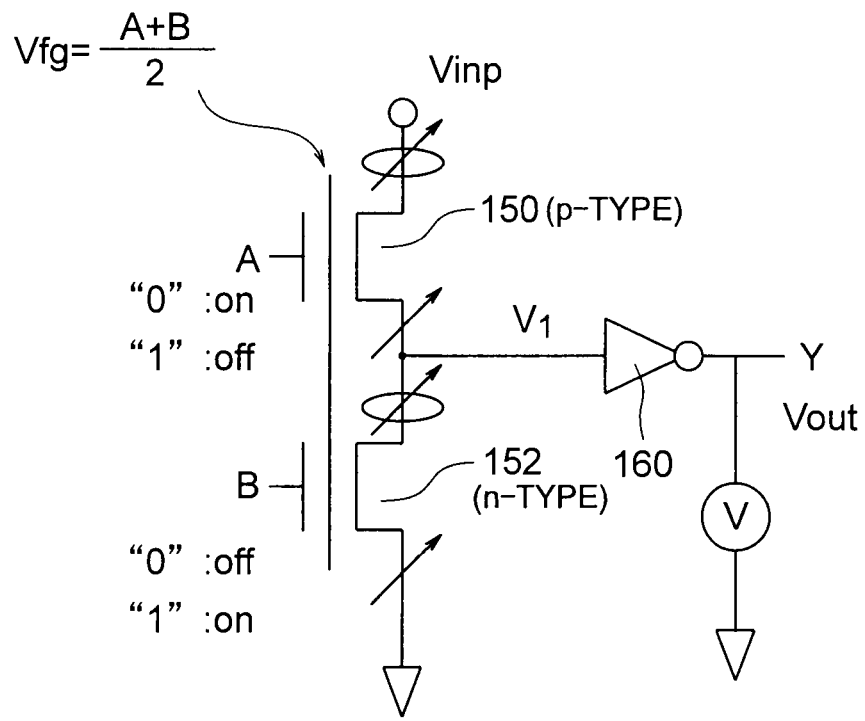
FIG. 21 shows a logic circuit according to a thirteenth embodiment.

If an AND circuit and an OR circuit can be formed, all circuits such as a NOR circuit and an exclusive OR circuit can be formed. Therefore, FIG. 21 shows only an AND circuit and an OR circuit. As shown in FIG. 21, the reconfigurable logic circuit of this embodiment basically uses two spin MOSFETs 150 and 152 of one of the first through twelfth embodiments and Examples 1 through 4. In each of the spin MOSFETs 150 and 152, a floating gate (not shown) and an interelectrode insulating film are provided between the gate insulating film 9 and the gate electrode 10. The spin MOSFET 150 is a p-type MOSFET, or a MOSFET formed in an n-type well region (not shown) of a p-type semiconductor substrate. The spin MOSFET 152 is an n-type MOSFET, or a MOSFET formed in a p-type semiconductor region of the p-type semiconductor substrate. The floating gates of the MOSFETs 150 and 152 are connected to each other to form the common floating gate. The source of the MOSFET 150 is connected to a power supply Vinp, and the source of the MOSFET 152 is grounded. An output V1 from the common-connected node is input to an inverter 160, and an output of this inverter 160 is an output Vout of the logic circuit of this embodiment.

Figure 22:
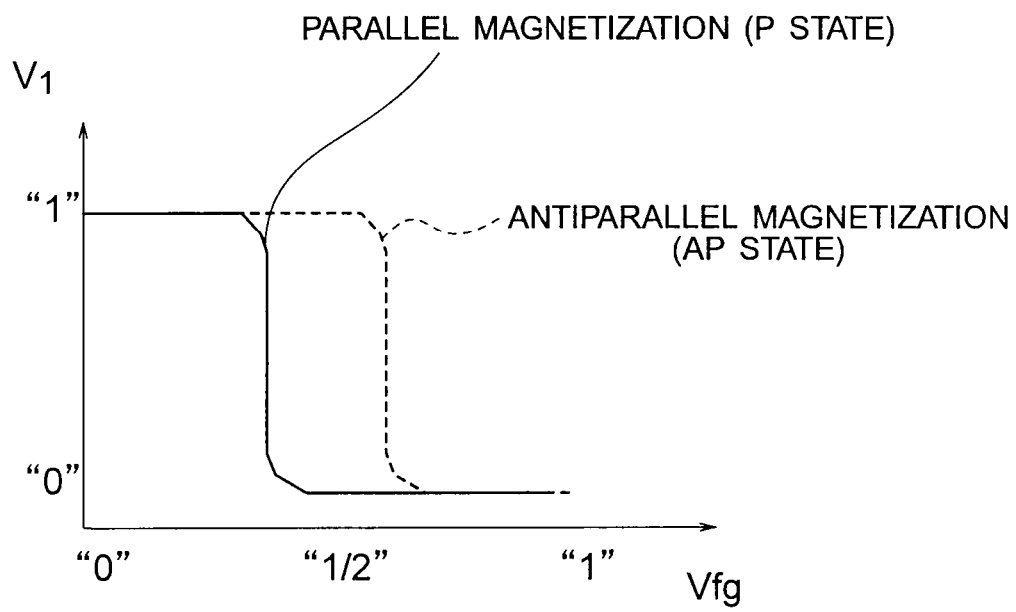
FIG. 22 shows the floating-gate voltage dependence of the output of the logic circuit of the thirteenth embodiment.

In this manner, an AND circuit and an OR circuit can be formed. As shown in FIG. 22, in a case where the floating gate voltage Vfg is ½ of the sum of the gate input A of the MOSFET 150 and the gate input B of the MOSFET 152, the output voltage Y obtained when the spin moments of the ferromagnetic layers of the source and drain closer to the semiconductor substrate 2 are in a parallel (P) state or an antiparallel (AP) state is changed to "1" or "0". In this embodiment, the spin moments in the MOSFET 150 are always in a parallel state.

FIG. 23 shows values of the floating gate potential Vfg, the potential V1 of the common-connected node between the MOSFETs 150 and 152, and the output Vout of the logic circuit, with respect to the inputs A and B of the gate electrodes of the MOSFETs 150 and 152 in a case where the spin moments in the ferromagnetic layers of the source and drain closer to the semiconductor substrate 2 in the MOSFET 152 are in an AP (antiparallel) state in the logic circuit of this embodiment. FIG. 24 shows values of the floating gate potential Vfg, the potential V1 of the common-connected node between the MOSFETs 150 and 152, and the output Vout of the logic circuit, with respect to the inputs A and B of the gate electrodes of the MOSFETs 150 and 152 in a case where the spin moments in the ferromagnetic layers of the source and drain closer to the semiconductor substrate 2 in the MOSFET 152 are in a P (parallel) state. As shown in FIGS. 23 and 24, the logic circuit becomes an AND circuit when the spin moments in the ferromagnetic layers of the source and drain closer to the semiconductor substrate 2 in the MOSFET 152 are in an antiparallel state. The logic circuit becomes an OR circuit when the spin moments in the ferromagnetic layers of the source and drain closer to the semiconductor substrate 2 in the MOSFET 152 are in a parallel state. Accordingly, by changing the spin moment in the ferromagnetic layer of the drain unit and performing reprogramming, a logic circuit can be formed without reconstruction, and a reconfigurable logic circuit can be obtained.

Figure 25:
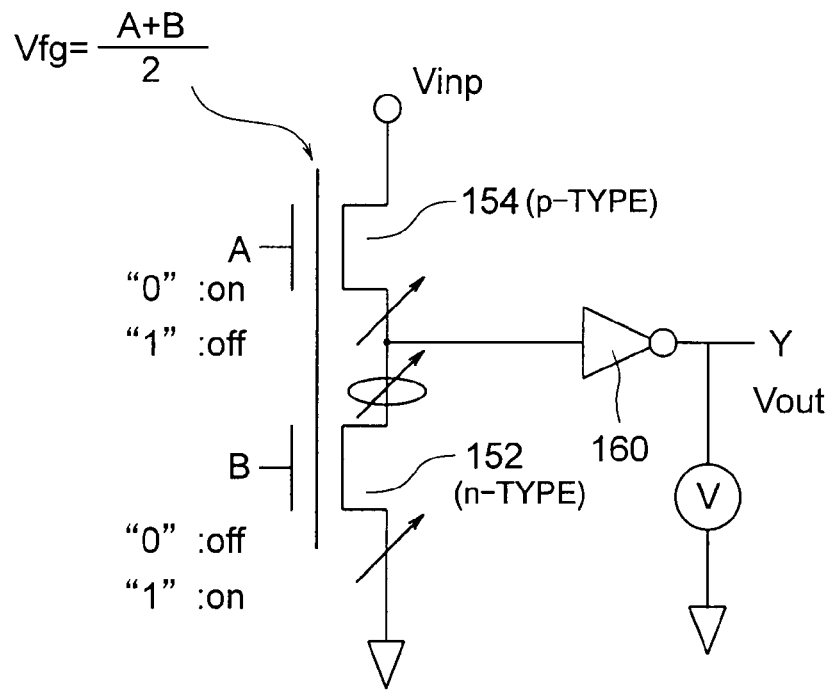
FIG. 25 shows a logic circuit according to a first modification of the thirteenth embodiment.

In the case of an AND circuit and an OR circuit, all the transistors may be spin MOSFETs, but it is possible to use conventional MOSFETs for some of the transistors. As shown in FIG. 25, one (the MOSFET 152, for example) of the two transistors may be a spin MOSFET of one of the first through twelfth embodiments and Example 1 through 4, and the other one may be a conventional p-MOSFET 154 not including a magnetic material. In such a case, the same effect as above can be achieved by controlling the spin moments in the ferromagnetic layers of the source and drain closer to the semiconductor substrate 2 in the spin MOSFET 152 between a parallel state and an antiparallel state.

Figure 26:
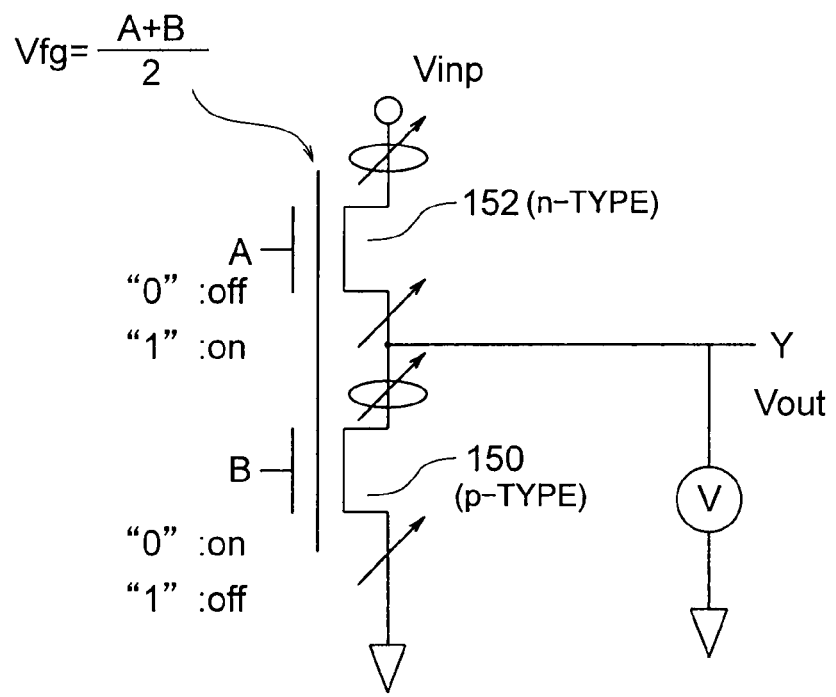
FIG. 26 shows a logic circuit according to a second modification of the thirteenth embodiment.

Also, as shown in FIG. 26, the spin moments in the ferromagnetic layers of the source and drain closer to the semiconductor substrate 2 in the p-type MOSFET 150 can be controlled between a parallel state and an antiparallel state by switching the connections of the n-type MOSFET 152 and the p-type MOSFET 150 without the use of the inverter 160. In this manner, the same effect as above can be achieved.

When used as the logic circuit, the structure according to this embodiment further includes a gate voltage control circuit for reading information from spin MOSFETs, a sense current control device circuit for controlling sense current, a write current control circuit, a driver, and a sinker.

The reconfigurable logic circuit of this embodiment is merely one specific example, and reconfigurable logic circuits that can be formed of spin MOSFETs of one of the first through twelfth embodiments and Examples 1 through 4 are not limited to the reconfigurable logic circuit of this embodiment.

Where any of the above spin MOSFETs is used, a device having high MR and low resistance can be realized, and accordingly, a reconfigurable logic circuit can be realized.

In accordance with any of the embodiments of the present invention, even when vertical magnetization films are used for the ferromagnetic material of a MTJ in the source/drain regions of a spin MOSFET, influence of a leakage magnetic field on adjacent transistors can be restrained, shift adjustment can be performed, and spin relaxation in the channel region can be restrained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A spin MOSFET, comprising:
   a source unit and a drain unit provided at a distance from each other on a semiconductor substrate, one of the source unit and the drain unit comprising a first ferromagnetic stacked film that includes a first ferromagnetic layer having a fixed magnetization direction perpendicular to a film plane, the other one of the source unit and the drain unit comprising a second ferromagnetic stacked film that includes a second ferromagnetic layer having a variable magnetization direction perpendicular to a film plane, a first tunnel barrier provided on the second ferromagnetic layer, and a third ferromagnetic layer provided on the first tunnel barrier and having a fixed magnetization direction perpendicular to a film plane and antiparallel to the magnetization direction of the first ferromagnetic layer;

a gate insulating film provided on a portion of the semiconductor substrate, the portion being located between the source unit and the drain unit;

a gate electrode provided on the gate insulating film;

a first hard bias film provided above the gate electrode;

a second hard bias film provided above a portion of the semiconductor substrate, the portion being located on a first side of the source unit, the first side being opposite to a second side on which the first hard bias film is disposed; and a third hard bias film provided above a portion of the semiconductor substrate, the portion being located on a third side of the drain unit, the third side being opposite to a fourth side on which the first hard bias film is disposed, magnetization directions of the first through third hard bias films being parallel to the magnetization direction of the third ferromagnetic layer.

2. The spin MOSFET according to claim 1, further comprising a stacked film that includes a nonmagnetic layer, a ferromagnetic layer having vertical magnetization, and an antiferromagnetic layer stacked in this order is formed on at least one of the first and second ferromagnetic stacked films, and the nonmagnetic layer includes at least one of Ru, Rh, and Ir.

3. The spin MOSFET according to claim 1, wherein the first and second ferromagnetic stacked films differ in film plane area or film plane shape.

4. The spin MOSFET according to claim 1, wherein a source region and a drain region are provided by introducing impurities into portions of the semiconductor substrate, the portions being located below the source unit and the drain unit, each of the source region and the drain region has a first impurity region and a second impurity region provided between the first impurity region and the source unit or the drain unit, the second impurity region having higher impurity density than the first impurity region, and the shortest distance between the source region and the drain region is 0.25 µm or less.

5. The spin MOSFET according to claim 1, wherein the first through third ferromagnetic layers each include one of a Fe—Pd layer, a Fe—Pt layer, a Fe—Pd—Pt layer, a Gd—Fe—Co layer, a Tb—Fe—Co layer, a Dy—Fe—Co layer, a Gd—Co layer, a Tb—Co layer, a Dy—Co layer, a multilayer of (Gd(—Fe)Co/Co(—Fe)—B)$_n$, a multilayer of (Tb(—Fe)Co/Co(—Fe)—B)$_n$, a multilayer of (Dy(—Fe)Co/Co(—Fe)—B)$_n$, a Co/Pd stacked film, a CoFe/Pd stacked film, a Co/Ni stacked film, a Fe/Pd stacked film, and a Fe/Pt stacked film.

6. A spin MOSFET, comprising:

a source unit and a drain unit provided at a distance from each other on a semiconductor substrate, one of the source unit and the drain unit comprising a first ferromagnetic stacked film that includes a first ferromagnetic layer having a fixed magnetization direction perpendicular to a film plane, the other one of the source unit and the drain unit comprising a second ferromagnetic stacked film that includes a second ferromagnetic layer having a variable magnetization direction perpendicular to a film plane, a first tunnel barrier provided on the second ferromagnetic layer, and a third ferromagnetic layer provided on the first tunnel barrier and having a fixed magnetization direction perpendicular to a film plane and antiparallel to the magnetization direction of the first ferromagnetic layer;

a gate insulating film provided on a portion of the semiconductor substrate, the portion being located between the source unit and the drain unit;

a gate electrode provided on the gate insulating film;

a first hard bias film provided on the gate electrode;

a second hard bias film provided on the source unit; and a third hard bias film provided on the drain unit, magnetization directions of the first through third hard bias films being substantially antiparallel to the magnetization direction of the third ferromagnetic layer.

7. The spin MOSFET according to claim 6, further comprising a stacked film that includes a nonmagnetic layer, a ferromagnetic layer having vertical magnetization, and an antiferromagnetic layer stacked in this order is formed on at least one of the first and second ferromagnetic stacked films, and the nonmagnetic layer includes at least one of Ru, Rh, and Ir.

8. The spin MOSFET according to claim 6, wherein the first and second ferromagnetic stacked films differ in film plane area or film plane shape.

9. The spin MOSFET according to claim 6, wherein a source region and a drain region are provided by introducing impurities into portions of the semiconductor substrate, the portions being located below the source unit and the drain unit, each of the source region and the drain region has a first impurity region and a second impurity region provided between the first impurity region and the source unit or the drain unit, the second impurity region having higher impurity density than the first impurity region, and the shortest distance between the source region and the drain region is 0.25 µm or less.

10. The spin MOSFET according to claim 6, wherein the first through third ferromagnetic layers each include one of a Fe—Pd layer, a Fe—Pt layer, a Fe—Pd—Pt layer, a Gd—Fe—Co layer, a Tb—Fe—Co layer, a Dy—Fe—Co layer, a Gd—Co layer, a Tb—Co layer, a Dy—Co layer, a multilayer of (Gd(—Fe)Co/Co(—Fe)—B)$_n$, a multilayer of (Tb(—Fe)Co/Co(—Fe)—B)$_n$, a multilayer of (Dy(—Fe)Co/Co(—Fe)—B)$_n$, a Co/Pd stacked film, a CoFe/Pd stacked film, a Co/Ni stacked film, a Fe/Pd stacked film, and a Fe/Pt stacked film.

11. A reconfigurable logic circuit, comprising two field effect transistors, at least one of the two field effect transistors being the spin MOSFET according to claim 1, the two field effect transistors having a common floating gate.

* * * * *